US011770897B2

(12) United States Patent
Lee et al.

(10) Patent No.: US 11,770,897 B2
(45) Date of Patent: Sep. 26, 2023

(54) PRINTED CIRCUIT BOARD AND ELECTRONIC DEVICE INCLUDING THE SAME

(71) Applicant: Samsung Electronics Co., Ltd., Suwon-si (KR)

(72) Inventors: Youngsun Lee, Suwon-si (KR); Sungwon Park, Suwon-si (KR); Sunghyup Lee, Suwon-si (KR); Byeonguk Min, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/545,374

(22) Filed: Dec. 8, 2021

(65) Prior Publication Data

US 2022/0151073 A1 May 12, 2022

Related U.S. Application Data

(63) Continuation of application No. PCT/KR2021/016336, filed on Nov. 10, 2021.

(30) Foreign Application Priority Data

Nov. 10, 2020 (KR) ................. 10-2020-0149694

(51) Int. Cl.
*H05K 1/14* (2006.01)
*H05K 1/11* (2006.01)
*H05K 1/03* (2006.01)

(52) U.S. Cl.
CPC ............. *H05K 1/148* (2013.01); *H05K 1/036* (2013.01); *H05K 1/11* (2013.01); *H05K 2201/0999* (2013.01); *H05K 2201/10128* (2013.01)

(58) Field of Classification Search
CPC .......... H05K 1/148; H05K 1/036; H05K 1/11; H05K 2201/0999; H05K 2201/10128
(Continued)

(56) References Cited

U.S. PATENT DOCUMENTS 10,736,211 B2    8/2020  Park et al.
2011/0228536 A1  9/2011  Im et al.
(Continued)

FOREIGN PATENT DOCUMENTS

JP    2005-183536 A       7/2005
JP    2005183536 A    *  7/2005
(Continued)

OTHER PUBLICATIONS

International Search Report with Written Opinion dated Feb. 18, 2022, issued in International Patent Application No. PCT/KR2021/016336.

*Primary Examiner* — Andargie M Aychillhum
(74) *Attorney, Agent, or Firm* — Jefferson IP Law, LLP

(57) ABSTRACT

A printed circuit board and an electronic device including the printed circuit board are provided. The electronic device includes a housing, and a printed circuit board located in an inner space of the housing, wherein the printed circuit board includes a component disposition area in which at least one component is disposed, a pre-forming area in which a plastic deformation material is laminated as a polymer material for inducing plastic deformation on a part of the printed circuit board, and a flexible area having flexible characteristics and on which the plastic deformation material is not laminated.

23 Claims, 15 Drawing Sheets

(58) Field of Classification Search
USPC .......................................................... 361/749
See application file for complete search history.

(56) References Cited

U.S. PATENT DOCUMENTS

| | | | | |
|---|---|---|---|---|
| 2014/0178625 | A1* | 6/2014 | Lauper | A44C 17/04 |
| | | | | 29/10 |
| 2015/0282304 | A1 | 10/2015 | Ely et al. | |
| 2017/0318688 | A1 | 11/2017 | Kim et al. | |
| 2020/0371558 | A1 | 11/2020 | Kim et al. | |
| 2022/0129046 | A1 | 4/2022 | Baek et al. | |
| 2022/0151073 | A1* | 5/2022 | Lee | H05K 1/11 |

FOREIGN PATENT DOCUMENTS

| | | | |
|---|---|---|---|
| JP | 2014-236020 A | | 12/2014 |
| JP | 2014236020 A | * | 12/2014 |
| JP | 2015-046463 A | | 3/2015 |
| JP | 2015046463 A | * | 3/2015 |
| JP | 2019-0086305 A | * | 7/2019 |
| KR | 10-2009-0054898 A | | 6/2009 |
| KR | 10-2011-0096510 A | | 8/2011 |
| KR | 10-2013-0134765 A | | 12/2013 |
| KR | 10-2017-0124120 A | | 11/2017 |
| KR | 10-2019-0086305 A | | 7/2019 |
| KR | 10-2020-0021172 A | | 2/2020 |
| KR | 2020-0021172 A | * | 2/2020 |
| KR | 10-2020-0100490 A | | 8/2020 |

\* cited by examiner

PRINTED CIRCUIT BOARD AND ELECTRONIC DEVICE INCLUDING THE SAME

CROSS-REFERENCE TO RELATED APPLICATION(S)

This application is a continuation application, claiming priority under § 365(c), of an International application No. PCT/KR2021/016336, filed on Nov. 10, 2021, which is based on and claims the benefit of a Korean patent application number 10-2020-0149694, filed on Nov. 10, 2020, in the Korean Intellectual Property Office, the disclosure of which is incorporated by reference herein in its entirety.

TECHNICAL FIELD

The disclosure relates to a printed circuit board and an electronic device including the same.

BACKGROUND ART

An electronic device may include at least one printed circuit board or a flexible printed circuit board (e.g., flexible printed circuit board (FPCB) type radio frequency (RF) cable (FRC)) for an electrical connection between electronic components disposed inside the electronic device.

It may be important for the printed circuit board or the flexible printed circuit board to have a robust structure capable of maintaining an electrical connection between electronic components even against an external impact.

The above information is presented as background information only to assist with an understanding of the disclosure. No determination has been made, and no assertion is made, as to whether any of the above might be applicable as prior art with regard to the disclosure.

DISCLOSURE OF INVENTION

Technical Problem

The printed circuit board may be formed based on a prepreg (PPG) substrate, and may typically include an epoxy (FR-4, FR-5, G-2, or G-11) material. Since the printed circuit board has a low elasticity and hard property, it may not be possible to transform the shape of the printed circuit board in accordance with the shape of an inner space of a housing.

The flexible printed circuit board may be formed based on a flexible substrate, and may typically include a polyimide material. The shape of the flexible printed circuit board may be freely transformed, but due to the high elasticity, the transformed shape may not be maintained.

Aspects of the disclosure are to address at least the above-mentioned problems and/or disadvantages and to provide at least the advantages described below. Accordingly, an aspect of the disclosure is to provide a printed circuit board which has a robust structure capable of maintaining an electrical connection between electronic components even against an external impact or a repeated bending operation and which can be easily assembled or disassembled through a partial formation of a part that can be elastically deformed well and a part that can be plastically deformed well, and an electronic device including the printed circuit board.

Additional aspects will be set forth in part in the description which follows and, in part, will be apparent from the description, or may be learned by practice of the presented embodiments.

Solution to Problem

In accordance with an aspect of the disclosure, an electronic device is provided. The electronic device includes a housing, and a printed circuit board located in an inner space of the housing, wherein the printed circuit board includes a component disposition area in which at least one component is disposed, a pre-forming area in which a plastic deformation material is laminated as a polymer material for inducing plastic deformation on a part of the printed circuit board, and a flexible area having flexible characteristics and on which the plastic deformation material is not laminated.

In accordance with another aspect of the disclosure, a printed circuit board electrically (or operably) connecting different components built in an electronic device with each other is provided. The printed circuit board includes a component disposition area in which at least one component is disposed, a pre-forming area in which a plastic deformation material is laminated as a polymer material for inducing plastic deformation on a part of the printed circuit board, and a flexible area having flexible characteristics and on which the plastic deformation material is not laminated.

Advantageous Effects of Invention

According to the printed circuit board according to various embodiments of the disclosure, since the part that can be elastically deformed well and the part that can be plastically deformed well are partially formed, the printed circuit board has the robust structure capable of maintaining the electrical connection between the electronic components even against the external impact or the repeated bending operation, and the printed circuit board can be easily assembled or disassembled.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

MODE FOR THE INVENTION

Figure 1:
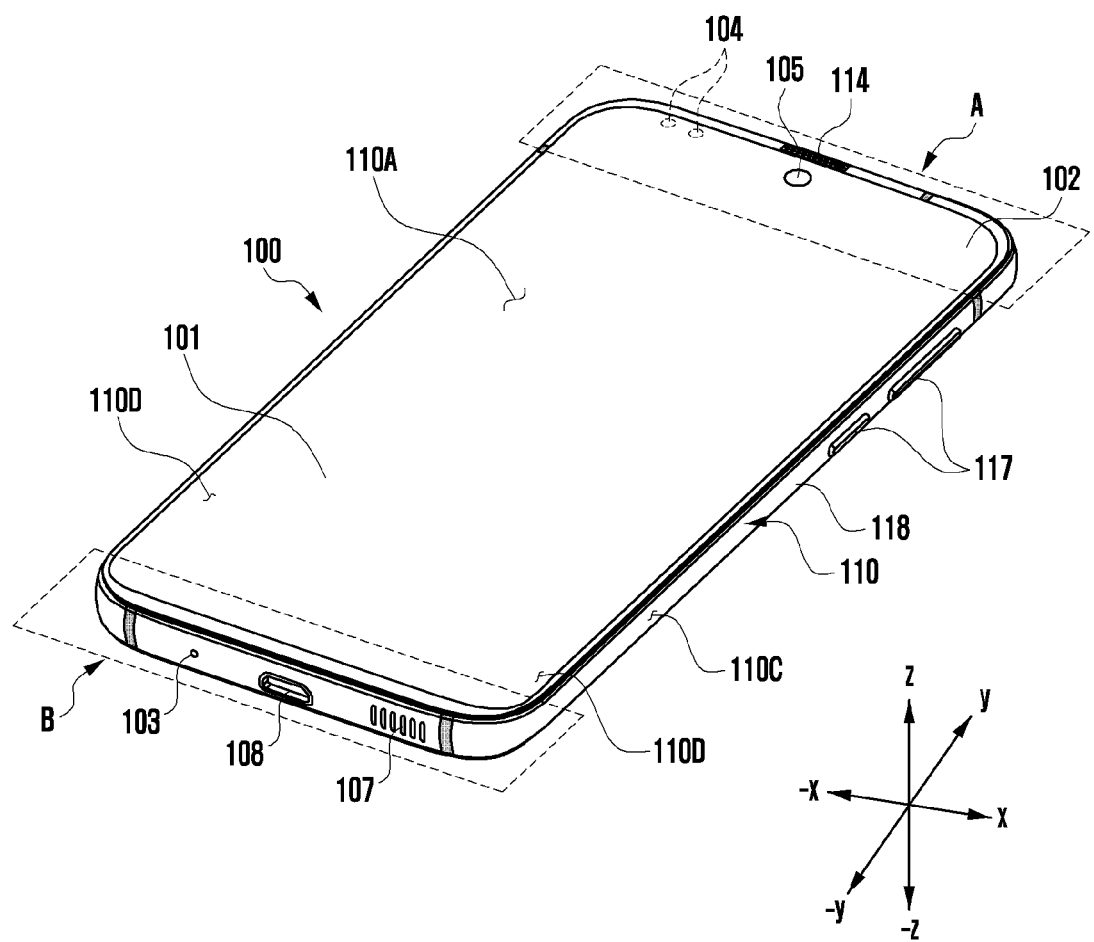
FIG. 1 is a perspective view of a front side of an electronic device according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The electronic devices according to various embodiments disclosed in this document may be various types of devices. The electronic device may include, for example, a portable communication device (e.g., smart phone), a computer device, a portable multimedia device, a portable medical device, a camera, a wearable device, or a home appliance. The electronic devices according to embodiments of this document are not limited to the above-described devices.

It should be appreciated that various embodiments of the disclosure and the terms used therein are not intended to limit the technological features set forth herein to particular embodiments and include various changes, equivalents, and/or replacements for a corresponding embodiment. With regard to the description of the drawings, similar reference numerals may be used to refer to similar elements. A singular form of a noun corresponding to an item may include one or a plurality of items, unless the relevant context clearly indicates otherwise. As used in the disclosure, each of such phrases as "A or B," "at least one of A and B," "at least one of A or B," "A, B, or C," "at least one of A, B, and C," or "at least one of A, B, or C" may include any one or all of possible combinations of the items enumerated together. Such terms as "1st," "2nd," "first," or "second" may be used to simply distinguish a corresponding component from another, and does not limit the components in other aspect (e.g., importance or order). If it is described that if an element (e.g., a first element) is referred to, with or without the term "operatively" or "communicatively", as "connected to," or "coupled to" another element (e.g., a second element), it means that the element may be connected to the other element directly (e.g., by wire), wirelessly, or via a third element.

Figure 2:
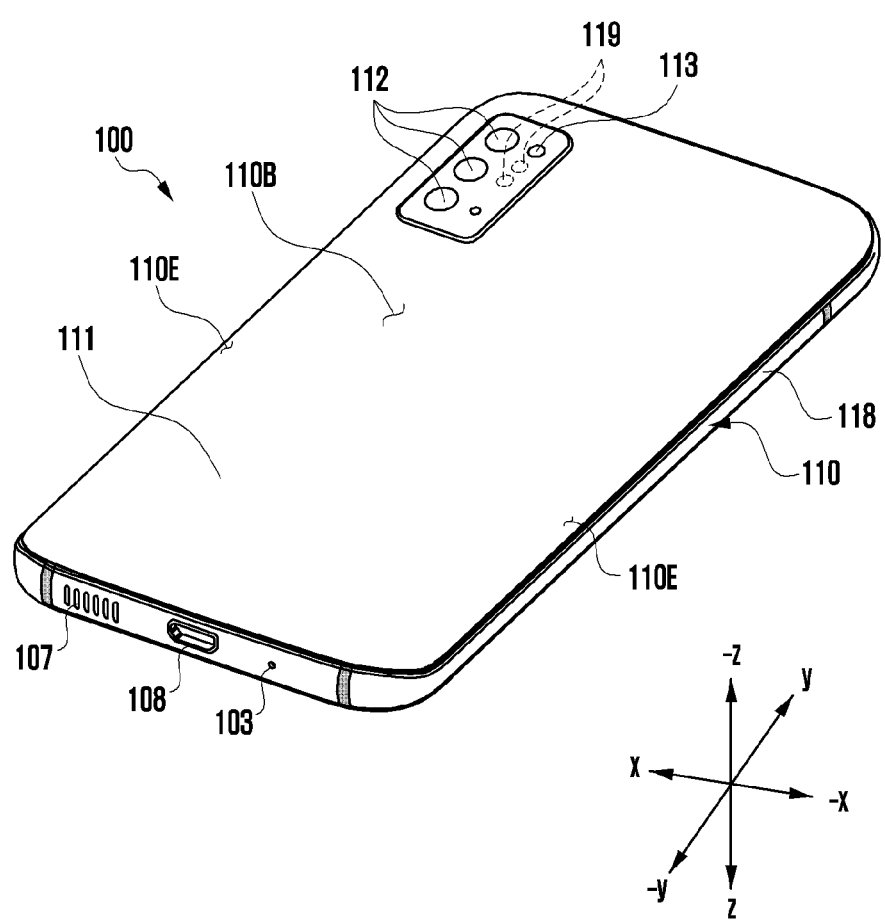
FIG. 2 is a perspective view of a rear side of the electronic device of FIG. 1 according to an embodiment of the disclosure.

FIG. 1 is a perspective view of a front side of an electronic device (e.g., mobile electronic device) according to an embodiment of the disclosure. FIG. 2 is a perspective view of a rear side of the electronic device of FIG. 1 according to an embodiment of the disclosure.

Referring to FIGS. 1 and 2, an electronic device 100 according to an embodiment may include a housing 110 including a first side (or front side) 110A, a second side (or rear side) 110B, and a side 110C surrounding a space between the first side 110A and the second side 110B. In another embodiment (not illustrated), the housing may refer to a structure forming a part of the first side 110A, the second side 110B, and the side 110C of FIG. 1. According to an embodiment, the first side 110A may be formed by a front plate 102 (e.g., glass plate including various coating layers or polymer plate) of which at least a part is substantially transparent. The second side 110B may be formed by a rear plate 111 being substantially opaque. The rear plate 111 may be formed by, for example, a coating or colored glass, ceramic, polymer, metal (e.g., aluminum, stainless steel (STS), or magnesium), or a combination of at least two of the above materials. The side 110C may be combined with the front plate 102 and the rear plate 111, and may be formed by a side bezel structure 118 (or "side member") including metal and/or polymer. In a certain embodiment, the rear plate 111 and the side bezel structure 118 may be integrally formed, and may include the same material (e.g., metal material such as aluminum).

The front plate 102 may include a first area 110D seamlessly extending from the first side 110A to be bent toward the rear plate at each of both ends of a long edge of the front plate. In the illustrated embodiment (refer to FIG. 2), the rear plate 111 may include a second area 110E seamlessly extending from the second side 110B to be bent toward the front plate at each of the both ends of the long edge. In a certain embodiment, the front plate 102 or the rear plate 111 may include only one of the first area 110D or the second area 110E. In a certain embodiment, the front plate 102 may not include the first area 110D and the second area 110E, but may include only a flat plane disposed in parallel to the second side 110B. In the above embodiments, as seen from the side of the electronic device, the side bezel structure 118 may have a first thickness (or width) on the side on which the first area 110D or the second area 110E is not included, and may have a second thickness that is thinner than the first thickness on the side on which the first area 110D or the second area 110E is included.

According to an embodiment, the electronic device 100 may include at least one of a display 101, an input device 103, sound output devices 107 and 114, first and second sensor modules 104 and 119, first and second camera modules 105 and 112, a key input device 117, an indicator (not illustrated), and a connector 108. In a certain embodiment, the electronic device 100 may omit at least one (e.g., key input device 117 or indicator) of the constituent elements, or may additionally include other constituent elements.

The display 101 may be visually exposed, for example, through a significant part of the front plate 102. In a certain embodiment, at least a part of the display 101 may be visually exposed through the first side 110A and the front plate 102 forming the first area 110D of the side 110C. The display 101 may be disposed to be combined with or adjacent to a touch sensing circuit, a pressure sensor capable of measuring the strength (pressure) of a touch, and/or a digitizer detecting a magnetic field type stylus pen. In a certain embodiment, at least a part of the first and second sensor modules 104 and 119 and/or at least a part of the key input device 117 may be disposed in the first area 110D and/or the second area 110E.

The input device 103 may include a microphone. In a certain embodiment, the input device 103 may include a plurality of microphones disposed to be able to detect the direction of a sound. The sound output devices 107 and 114 may include speakers. The speakers may include an external speaker (e.g., sound output device 107) and a receiver (e.g., sound output device 114) for calling. In a certain embodiment, the input device 103 (e.g., microphone), the sound output devices 107 and 114 (e.g., speakers), and the connector 108 may be disposed at least partly in the inner space of the electronic device 100, and may be exposed to an external environment through at least one hole formed on the housing 110. In a certain embodiment, the hole formed on the housing 110 may be commonly used for the microphone and the speakers. In a certain embodiment, the sound output devices 107 and 114 may include a speaker (e.g., piezoelectric speaker) operating in a state where the hole formed on the housing 110 is excluded.

The first and second sensor modules 104 and 119 may generate an electrical signal or a data value corresponding to the internal operation state of the electronic device 100 or the external environment state. The first and second sensor modules 104 and 119 may include the first sensor module 104 (e.g., proximity sensor), a second sensor module (not illustrated) (e.g., fingerprint sensor) disposed on the first side 110A of the housing 110, and a third sensor module (e.g., second sensor module 119) (e.g., heart rate monitor (HRM) sensor) disposed on the second side 110B of the housing 110. The fingerprint sensor may be disposed under the first side 110A (e.g., home key button) of the housing 110, a partial area of the second side 110B, and/or the display 101. The electronic device 100 may further include at least one of sensor modules not illustrated, for example, a gesture sensor, a gyro sensor, a barometric pressure sensor, a magnetic sensor, an acceleration sensor, a grip sensor, a color sensor, an infrared (IR) sensor, a biosensor, a temperature sensor, a humidity sensor, a proximity sensor, or an illuminance sensor.

The first and second camera modules 105 and 112 may include the first camera module 105 disposed on the first side 110A of the electronic device 100, the second camera module 112 disposed on the second side 110B, and/or a flash 113. The first and second camera modules 105 and 112 may include one or a plurality of lenses, an image sensor, and/or an image signal processor. The flash 113 may include, for example, a light-emitting diode or a xenon lamp. In a certain embodiment, two or more lenses (wide angle lens, ultra-wide angle lens, or telephoto lens) and image sensors may be disposed on one side of the electronic device 100.

The key input device 117 may be disposed on the side 110C of the housing 110. In another embodiment, the electronic device 100 may not include some or all of the above-described key input devices, and the key input device 117 that is not included may be implemented on the display 101 in the form of a soft key or a touch key. As another embodiment, the key input device 117 may be implemented using the pressure sensor included in the display 101.

The indicator may be disposed, for example, on the first side 110A of the housing 110. The indicator may provide, for example, status information of the electronic device 100 in the form of light (e.g., light-emitting element). In another embodiment, the light-emitting element may provide a light source interlocking with the operation of the first camera module 105. The indicator may include, for example, a light emitting diode (LED), an IR LED, and/or a xenon lamp.

The connector 108 may include a first connector hole capable of accommodating a connector (e.g., universal serial bus (USB) connector) for transmitting and receiving a power and/or data to and from an external electronic device, and/or a second connector hole (or earphone jack) (not illustrated) capable of accommodating a connector for transmitting and receiving an audio signal to and from the external electronic device.

A part (e.g., first camera module 105) of the first and second camera modules 105 and 112, a part (e.g., first sensor module 104) of the first and second sensor modules 104 and 119, or the indicator may be disposed to be exposed through the display 101. For example, the first camera module 105, the first sensor module 104, or the indicator may be disposed in the inner space of the electronic device 100 so as to come in contact with an external environment through a through-hole perforated up to the front plate 102 of the display 101. As another embodiment, the first sensor module 104 may be disposed in the inner space of the electronic device so as to perform its function without being visually exposed through the front plate 102. For example, the area of the display 101, facing the sensor module, may not necessitate the through-hole.

According to various embodiments, the electronic device 100 may include at least one antenna radiator (e.g., conductive part 4212 of FIG. 4) constructed through at least a part of the side bezel structure 118. According to an embodiment, the at least one antenna radiator (e.g., conductive part 4212 of FIG. 4) may be disposed on a top area (e.g., area A) and/or a bottom area (e.g., area B) of the electronic device 100. The at least one antenna radiator (e.g., conductive part 4212 of FIG. 4) according to various embodiments of the disclosure may be electrically (or operably) connected to a printed circuit board (e.g., printed circuit board 600 of FIG. 4) through at least one electrical connection member (e.g., first, second, and third electrical connection members 500, 500-1, and 500-2 of FIG. 4) disposed inside the electronic device 100, and thus may be configured to operate in at least one frequency band.

Figure 3:
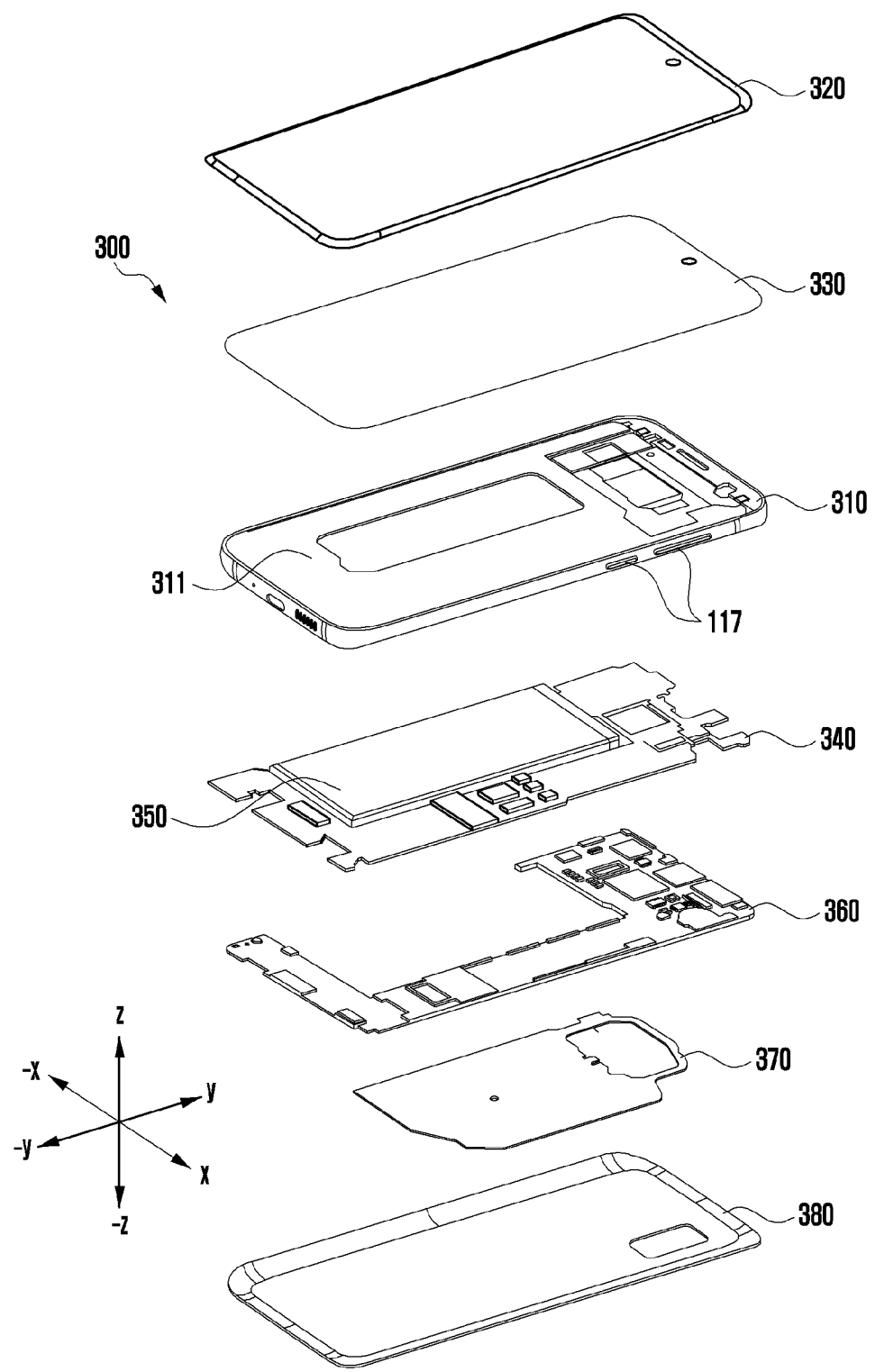
FIG. 3 is an exploded perspective view of the electronic device of FIG. 1 according to an embodiment of the disclosure.

FIG. 3 is an exploded perspective view of the electronic device of FIG. 1 according to an embodiment of the disclosure.

The electronic device of FIG. 3 may be at least partly similar to the electronic device 100 of FIG. 1 and FIG. 2, or may include another embodiment of the electronic device.

Referring to FIG. 3, an electronic device 300 (e.g., electronic device 100 of FIG. 1 or FIG. 2) may include a side member 310 (e.g., side bezel structure), a first support member 311 (e.g., bracket or support structure), a front plate 320 (e.g., front cover), a display 330 (e.g., display 101 of FIG. 1), a substrate 340 (e.g., printed circuit board (PCB), flexible PCB (FPCB), or rigid-flexible PCB (RFPCB)), a battery 350, a second support member 360 (e.g., rear case), an antenna 370, and a rear plate 380 (e.g., rear cover). In a certain embodiment, the electronic device 300 may omit at least one (e.g., first support member 311 or second support member 360) of constituent elements, or may additionally include another constituent element. The at least one of the constituent elements of the electronic device 300 may be the same as or similar to at least one of the constituent elements of the electronic device 100 of FIG. 1 or FIG. 2, and hereinafter, duplicate explanation thereof will be omitted.

The first support member 311 may be disposed inside the electronic device 300, and may be connected to the side member 310, or may be integrally formed with the side member 310. The first support member 311 may be formed of, for example, a metal material and/or a non-metal (e.g., polymer) material. The first support member 311 may have one side combined with the display 330 and the other side combined with the substrate 340. On the substrate 340, a processor, a memory, and/or an interface may be mounted. The processor may include, for example, one or more of a central processing unit, an application processor, a graphic processing device, an image signal processor, a sensor hub processor, or a communication processor.

The memory may include, for example, a volatile memory or a nonvolatile memory.

The interface may include, for example, a high definition multimedia interface (HDMI), a universal serial bus (USB) interface, a secure digital (SD) card interface, and/or an audio interface. The interface, for example, may electrically or physically connect the electronic device 300 to an external electronic device, and may include a USB connector, an SD card/multimedia card (MMC) connector, or an audio connector.

The battery 350 is a device for supplying a power to at least one constituent element of the electronic device 300, and may include, for example, a non-rechargeable primary cell, a rechargeable secondary cell, or a fuel cell. At least a part of the battery 350 may disposed, for example, on substantially the same plane as the substrate 340. The battery 350 may be integrally disposed inside the electronic device 300. As another embodiment, the battery 350 may be disposed detachably from the electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370, for example, may perform a short-range communication with an external device, or may wirelessly transmit and receive a power necessary for charging. In another embodiment, an antenna structure may be formed by a part or a combination of the side member 310 and/or the first support member 311.

An electronic device (e.g., electronic device 400 of FIG. 4) according to various embodiments of the disclosure may include a housing (e.g., housing 110 of FIG. 1), and a printed circuit board (e.g., printed circuit board 600 of FIG. 4) located in an inner space of the housing 110, wherein the printed circuit board 600 includes a component disposition area (e.g., component disposition area of first part 610 of FIG. 5) in which at least one component is disposed, a pre-forming area (e.g., pre-forming area of second part 620 of FIG. 5) in which a plastic deformation material is laminated as a polymer material for inducing plastic deformation on a part of the printed circuit board 600, and a flexible area (e.g., flexible area of third part 630 of FIG. 5) having flexible characteristics and on which the plastic deformation material is not laminated.

According to an embodiment, the flexible area of third part 630 may be disposed adjacent to a connector disposition area (e.g., connector disposition area 631 of FIG. 5) in which a connector of the printed circuit board 600 is disposed.

According to an embodiment, the plastic deformation material may cause an elastic deformation to occur in a region in which an elongation is less than 10%, and may cause the plastic deformation to occur in a region in which the elongation is within 10% to 80%.

According to an embodiment, the plastic deformation material may have characteristics in that a modulus value is equal to or smaller than 15 MPa in the region in which elongation is within 10% to 80%.

According to an embodiment, the plastic deformation material may have characteristics in that a break occurs in a region in which the elongation is equal to or larger than 80%.

According to an embodiment, the printed circuit board 600 may be formed in a 4-layer structure including 4 copper layers, and the plastic deformation material may be laminated between a first copper layer and a second copper layer and between a third copper layer and a fourth copper layer of the printed circuit board 600.

According to an embodiment, the printed circuit board 600 may be formed in a 4-layer structure including 4 copper layers, and the plastic deformation material may be laminated between a first copper layer and a second copper layer, between the second copper layer and a third copper layer, and between the third copper layer and a fourth copper layer of the printed circuit board 600.

According to an embodiment, in the flexible area of third part 630 of the printed circuit board 600, the plastic deformation material may not be laminated, but a shielding film may be laminated on the same layer as the plastic deformation material.

According to an embodiment, in the flexible area of third part 630 of the printed circuit board 600, the plastic deformation material may not be laminated, but an air gap may be formed on the same layer as the plastic deformation material.

According to an embodiment, the electronic device (e.g., electronic device 400 of FIG. 4) may have a bar type shape.

Figure 11:
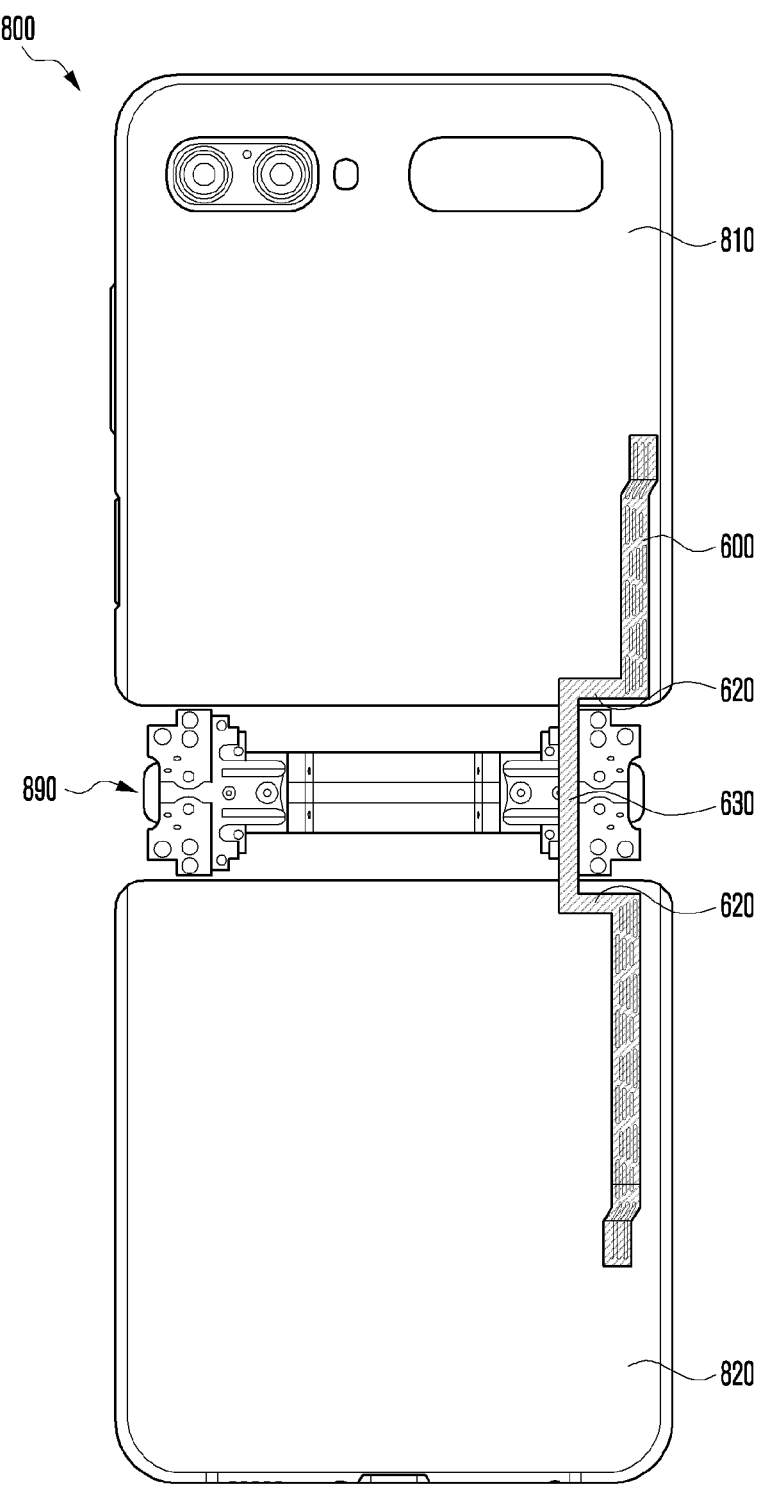
FIG. 11 is a view explaining a printed circuit board installed inside a foldable electronic device according to an embodiment of the disclosure.

According to an embodiment, the housing 110 may be a foldable housing (e.g., a pair of first and second housings 810 and 820 of FIG. 8) that is foldable based on a hinge module, and the flexible area of third part 630 of the printed circuit board 600 may be disposed adjacent to the hinge module (e.g., hinge module 890 of FIG. 11).

According to an embodiment, the electronic device may further include a slide plate (e.g., slide plate 1260 of FIG. 12) moving to slide in a designated direction from the housing 110 based on movement of a roller (e.g., roller 1430 of FIG. 14) located inside the housing 110, and a flexible display (e.g., flexible display 1230 of FIG. 12) supported by the housing 110 and the slide plate 1260, wherein the printed circuit board 600 may be disposed to pass through the roller, and may electrically (or operably) connect different components located inside the housing 110 with each other, and the flexible area of third part 630 of the printed circuit board 600 may be disposed adjacent to the roller.

The printed circuit board 600 electrically (or operably) connecting different components built in an electronic device (e.g., electronic device 400 of FIG. 4) with each other according to various embodiments of the disclosure may include a component disposition area of first part 610 in which at least one component is disposed, a pre-forming area of second part 620 in which a plastic deformation material is laminated as a polymer material for inducing plastic deformation on a part of the printed circuit board 600, and a flexible area of third part 630 having flexible characteristics and on which the plastic deformation material is not laminated.

According to an embodiment, the flexible area of third part 630 may be disposed adjacent to a connector disposition area 631 in which a connector of the printed circuit board 600 is disposed.

According to an embodiment, the plastic deformation material may cause an elastic deformation to occur in a region in which an elongation is less than 10%, and may cause the plastic deformation to occur in a region in which the elongation is within 10% to 80%.

According to an embodiment, the plastic deformation material may have characteristics in that a modulus value is equal to or smaller than 15 MPa in the region in which the elongation is within 10% to 80%.

According to an embodiment, the plastic deformation material may have characteristics in that a break occurs in a region in which the elongation is equal to or larger than 80%.

According to an embodiment, the printed circuit board 600 may be formed in a 4-layer structure including 4 copper layers, and the plastic deformation material may be laminated between a first copper layer and a second copper layer and between a third copper layer and a fourth copper layer of the printed circuit board 600.

According to an embodiment, the printed circuit board 600 may be formed in a 4-layer structure including 4 copper layers, and the plastic deformation material may be laminated between a first copper layer and a second copper layer, between the second copper layer and a third copper layer, and between the third copper layer and a fourth copper layer of the printed circuit board 600.

According to an embodiment, in the flexible area of third part 630 of the printed circuit board 600, the plastic deformation material is not laminated, but a shielding film may be laminated, or an air gap may be formed on the same layer as the plastic deformation material.

Figure 4:
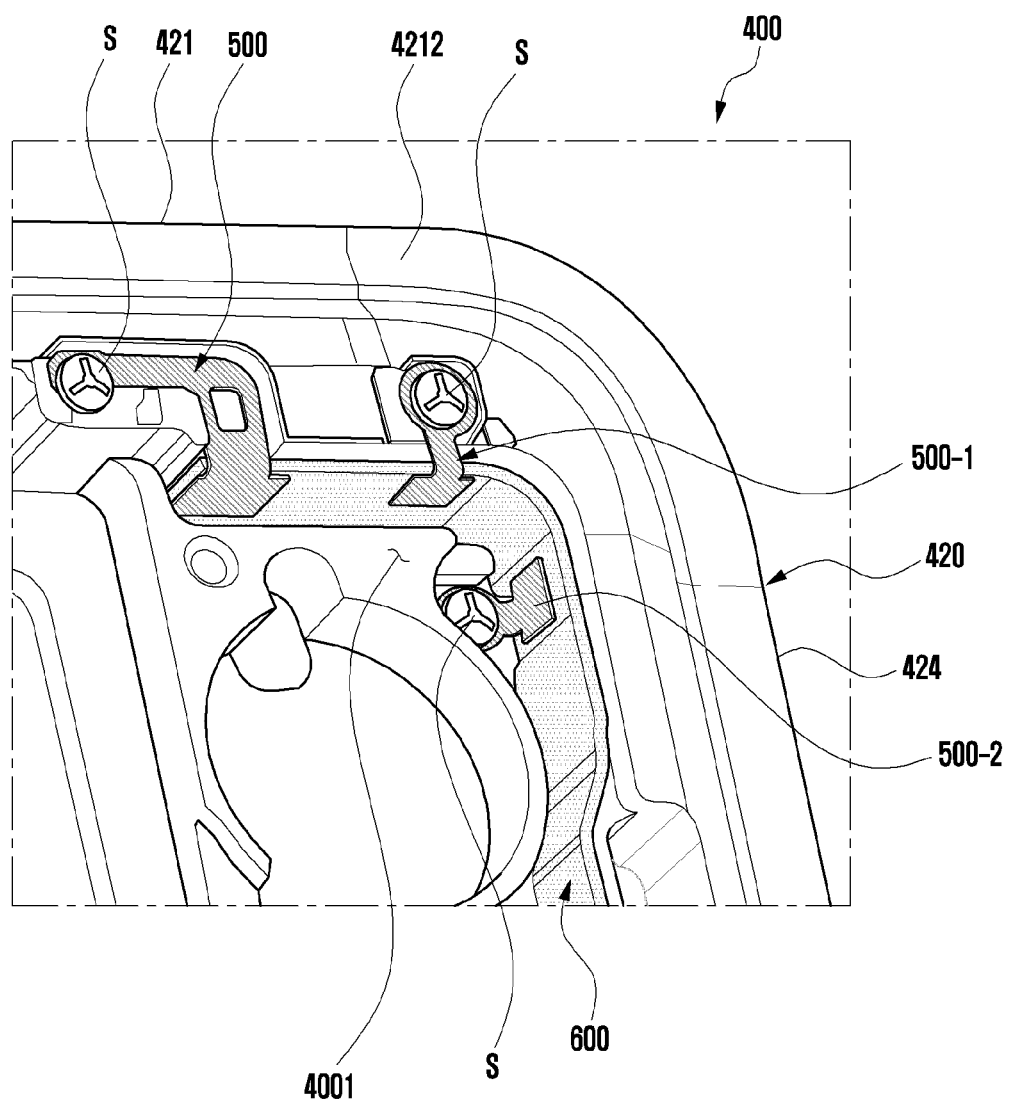
FIG. 4 is a view illustrating a partial configuration of an electronic device according to an embodiment of the disclosure.

FIG. 4 is a view illustrating a partial configuration of an electronic device according to an embodiment of the disclosure.

The electronic device of FIG. 4 may be at least partly similar to the electronic device 100 of FIG. 1 and/or the electronic device 300 of FIG. 3, or may include other embodiments of the electronic device.

Referring to FIG. 4, an electronic device 400 (e.g., electronic device 100 of FIG. 1 and/or electronic device 300 of FIG. 3) may include a housing (housing 110 of FIG. 1) (e.g., housing structure) including a front cover (e.g., front plate 102 of FIG. 1) (e.g., first cover or first plate), a rear cover (e.g., rear plate 111 of FIG. 2) (e.g., second cover or second plate) directed in an opposite direction to the front cover, and a side member 420 (e.g., side bezel structure 118 of FIG. 1) surrounding an inner space 4001 between the front cover and the rear cover. According to an embodiment, the side member 420 may be formed of a conductive member at least partly.

According to various embodiments, the side member 420 may include a first side 421 having a first length, a second side (not illustrated) extending from the first side 421 in a vertical direction and having a second length that is longer than the first length, a third side (not illustrated) extending from the second side (not illustrated) in a direction parallel to the first side 421 and having the first length, and a fourth side 424 extending from the third side in a direction parallel to the second side (not illustrated) and having the second length. According to an embodiment, the side member 420 may include the conductive part 4212.

According to the illustrated example, although the conductive part 4212 is formed on the first side 421, it may be selectively formed on respective sides of the side member 420. For example, the electronic device 400 may include at least one conductive part disposed in substantially a similar manner even on the bottom area (e.g., area B of FIG. 1) of the side member 420 not illustrated.

According to various embodiments, the electronic device 400 may include the printed circuit board 600 disposed in the inner space 4001. According to an embodiment, the printed circuit board 600 may include at least one wireless communication circuit (e.g., feeding part). According to an embodiment, the printed circuit board 600 may be electrically (or operably) connected to the conductive part 4212 through a plurality of electrical connection members (e.g., first, second, and third electrical connection members 500, 500-1, and 500-2) according to various embodiments of the disclosure. For example, the electronic device 4002 may be configured to transmit and/or receive a wireless signal in at least one designated frequency band by using the conductive part 4212 being connected to the printed circuit board 600 as an antenna radiator.

According to an embodiment, at least a part of each of the plurality of electrical connection members may have a bent shape. For example, each of the plurality of electrical connection members may include a part fixed to at least a part of the printed circuit board 600 by a fixing structure such as soldering, and a part bent from one end of the one side and fixed to the conductive part 4212 through a locking device S (e.g., screw). In a certain embodiment, the first, second, and third electrical connection members 500, 500-1, and 500-2 may be electrically (or operably) connected to the printed circuit board 600 through conductive contacts (e.g., C-clip, conductive tape, soldering, or connector). For example, the first, second, and third electrical connection members 500, 500-1, and 500-2 may be electrically connected to the printed circuit board 600 by using thermocompression, laser bonding, ultrasonic bonding, soldering bonding, and/or connector connection method.

According to an embodiment, the first, second, and third electrical connection members 500, 500-1, and 500-2 may be fixed in a manner of being branched from at least a part of the printed circuit board 600. For example, the printed circuit board 600 may be disposed to be bent at a corner part where the first side 421 and the fourth side 424 of the side member 420 meet each other in the inner space 4001 of the electronic device 400. In this case, the first electrical connection member 500 and the second electrical connection member 500-1, being branched from the printed circuit board 600, may be fixed to a part corresponding to the first side 421 through the locking device S, and the third electrical connection member 500-2 may be fixed to a part corresponding to the fourth side 424 through the locking device S.

Figure 5:
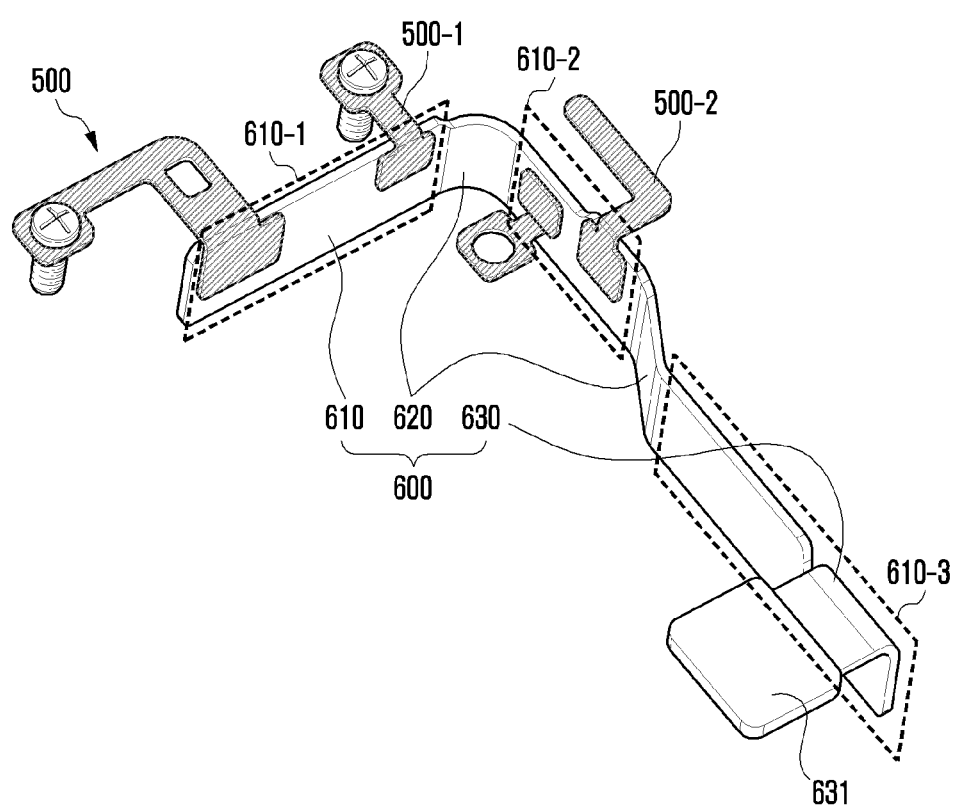
FIG. 5 is a perspective view illustrating in detail a printed circuit board according to an embodiment of the disclosure.

FIG. 5 is a perspective view illustrating in detail a printed circuit board according to an embodiment of the disclosure.

Figure 6:
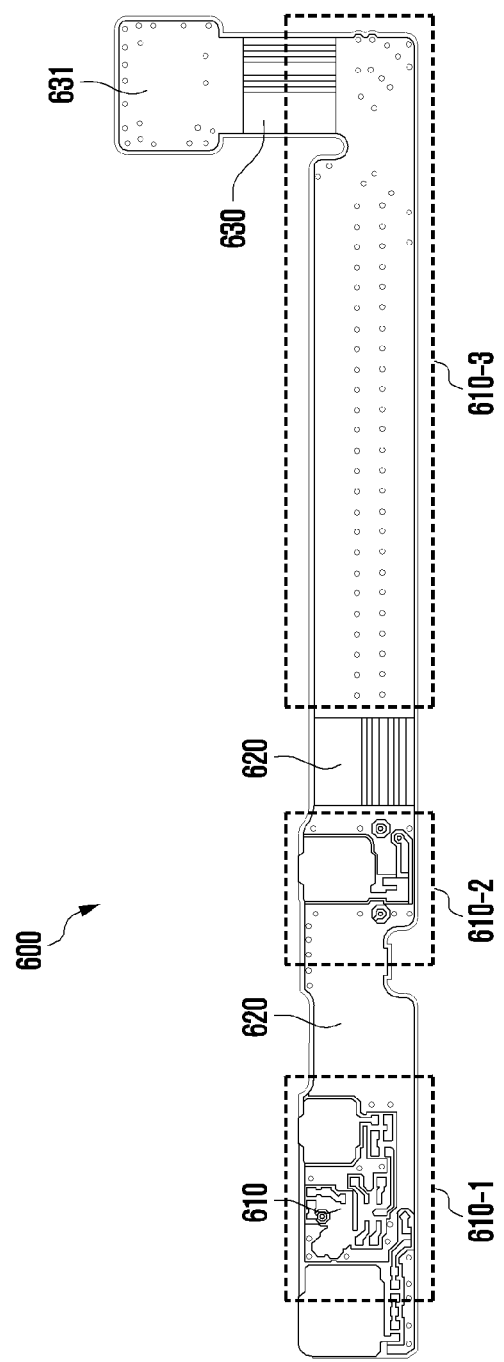
FIG. 6 is a plan view illustrating a printed circuit board according to an embodiment of the disclosure.

FIG. 6 is a plan view illustrating a printed circuit board according to an embodiment of the disclosure. For example, FIG. 6 may be a plan view illustrating an initial printed circuit board before being assembled in an inner space of an electronic device (e.g., electronic device 400 of FIG. 4).

The printed circuit board illustrated in FIG. 5 and FIG. 6 may be at least partly similar to the printed circuit board 600 illustrated in FIG. 4, or may include other embodiments of the printed circuit board 600 illustrated in FIG. 4.

Referring to FIGS. 5 and 6, a printed circuit board 600 (e.g., printed circuit board 600 of FIG. 4) according to various embodiments may include a part that can be plastically deformed well (e.g., component disposition area of first part 610 and/or pre-forming area of second part 620) and/or a part that can be elastically deformed well (e.g., flexible area of third part 630).

According to an embodiment, the printed circuit board 600 may include at least one component disposition area in which at least one component is disposed. According to an embodiment, the at least one component (not illustrated) disposed on the printed circuit board 600 may include a connector, a switch, a resistor, a capacitor, an inductor, a diode, a transistor, an integrated circuit, an antenna, a speaker, a piezoelectric element, a clip, and/or a bracket. According to an embodiment, the at least one component disposition area may be defined as a first part 610 (or first area) of the printed circuit board 600. According to an embodiment, the component disposition area of the printed circuit board 600 may include at least one layer on which a plastic deformation material is laminated, and thus may be formed to be plastically deformed well.

According to an embodiment, the component disposition area may include a first component disposition area 610-1, a second component disposition area 610-2, and/or a third component disposition area 610-3.

According to an embodiment, the first component disposition area 610-1 may be one area of the printed circuit board 600 disposed to face the first side 421, and may be adjacent to the first electrical connection member 500 and the second electrical connection member 500-1.

According to an embodiment, the second component disposition area 610-2 may be one area of the printed circuit board 600 disposed to face the fourth side 424, and may be adjacent to the third electrical connection member 500-2.

According to an embodiment, the third component disposition area 610-3 may be one area of the printed circuit board 600 disposed to face the fourth side 424, and may be located between the connector disposition area 631 and the third electrical connection member 500-2.

According to an embodiment, the plastic deformation material may be an epoxy series polymer material for inducing the plastic deformation. For example, the plastic deformation material may be a laminated material that has a plastic modulus of 15 MPa or less. The plastic deformation material as above will be described in detail later with reference to FIG. 7.

According to an embodiment, the printed circuit board 600 may include at least one pre-forming area of second part 620 of which the shape is transformed by a worker (or assembly automation machine) assembling the electronic device before assembling the printed circuit board 600 in the inner space 4001 of the electronic device (e.g., electronic device 400 of FIG. 4). According to an embodiment, the pre-forming area of second part 620 may be defined as a second part 620 (or second area) of the printed circuit board 600. According to an embodiment, the pre-forming area of second part 620 may be bent or unfolded by the worker (or assembly automation machine). According to an embodiment, the pre-forming area of second part 620 of the printed circuit board 600 may be pre-bent to correspond to a bent area of the inner space 4001 of the electronic device (e.g., electronic device 400 of FIG. 4). According to an embodiment, the pre-forming area of second part 620 may be formed to be bent at a corner part where the first side 421 and the fourth side 424 of the side member 420 meet each other. According to an embodiment, in case that a stepped portion (not illustrated) exists on the surface of the first side 421 and/or the surface of the fourth side 424 of the side member 420, the pre-forming area of second part 620 may be formed to be bent at a part facing the stepped portion.

According to an embodiment, since the pre-forming area of second part 620 of the printed circuit board 600 includes at least one layer on which the plastic deformation material is laminated, it may be formed to be plastically deformed well. For example, the pre-forming area of second part 620 may include at least one layer on which the plastic deformation material is laminated, and thus the shape of the pre-forming area of second part 620 may be maintained after being bent or unfolded by the worker (or assembly automation machine).

According to an embodiment, the printed circuit board 600 may include a flexible area of third part 630 having the flexible characteristics. According to an embodiment, the flexible area of third part 630 may be defined as a third part 630 (or third area) of the printed circuit board 600. According to an embodiment, the flexible area of third part 630 of the printed circuit board 600 may be an area in which the plastic deformation material is not laminated, and may be a part to be elastically deformed well. According to an embodiment, the flexible area of third part 630 may be located on a part (neck part of the connector disposition area 631) adjacent to the connector disposition area 631 on which the connector (not illustrated) of the printed circuit board 600 is disposed when the printed circuit board 600 is assembled in the inner space 4001 of the electronic device (e.g., electronic device 400 of FIG. 4). The flexible area of third part 630 is a part of which bending and unfolding operations are repeatedly performed several times for the assembly of the connector disposition area 631, and thus it may require high reliability to be not damaged even by the repeated bending operations. The flexible area of third part (630) of the printed circuit board 600 according to various embodiments of the disclosure may include a structure in which polyimide flexible copper clad laminate (FCCL)/coverlay is laminated to maintain the flexibility, and thus may have high reliability to be not damaged even by the repeated bending operations.

According to various embodiments, the printed circuit board 600 may include a laminated structure as being disclosed in Table 1 to Table 3.

TABLE 1

| Layer | Material | | First part 610 (Component disposition area) | Second part 620 (Pre-forming area) | Third part 630 (Flexible area) |
|---|---|---|---|---|---|
| | EPOXY Adhesive | | ○ | ○ | X |
| | COVERLAY (Normal Df) | C/L Film | ○ | ○ | X |
| | | C/L Adhesive | ○ | ○ | X |
| 1L | CCL (Low Df) | Cu plating | ○ | X | X |
| | | Copper(H/E) | ○ | X | X |
| | | Polyimide | ○ | ○ | X |
| | Plastic deformation material | | ○ | ○ | X |
| | COVERLAY (Normal Df) | C/L Film | X | X | ○ |
| | | C/L Adhesive | X | X | ○ |
| 2L | CCL (Low Df) | Copper | ○ | ○ | ○ |
| | | Polyimide | ○ | ○ | ○ |
| 3L | | Copper | ○ | ○ | ○ |
| | COVERLAY (Normal Df) | C/L Adhesive | X | X | ○ |
| | | C/L Film | X | X | ○ |
| | Plastic deformation material | | ○ | ○ | X |
| 4L | CCL (Low Df) | Polyimide | ○ | ○ | X |
| | | Copper(H/E) | ○ | X | X |
| | | Cu plating | ○ | X | X |
| | COVERLAY (Normal Df) | C/L Adhesive | ○ | ○ | X |
| | | C/L Film | ○ | ○ | X |
| | Adhesive | | ○ | X | X |
| | EPOXY | | ○ | X | X |
| | PC(polycarbonate) sheet | | | | |

In Table 1, a part denoted by 0 may mean that a corresponding material is laminated on a corresponding layer. For example, in a cell in which a row corresponding to Cu plating of 1L layer in Table 1 and a column corresponding to the first part 610 cross each other, a case that 0 is denoted may mean that Cu plating is laminated on 1L layer in the first part 610 of the printed circuit board 600.

In Table 1, a part denoted by X may mean that a corresponding material is not laminated on a corresponding layer. For example, in a cell in which a row corresponding to Cu plating of 1L layer in Table 1 and a column corresponding to the second part 620 cross each other, a case that X is denoted may mean that Cu plating is not laminated on 1L layer in the second part 620 of the printed circuit board 600.

Referring to Table 1, the printed circuit board 600 according to an embodiment of the disclosure may have a 4-layer (1L, 2L, 3L, and 4L) structure including total 4 copper layers.

According to an embodiment, the printed circuit board 600 may include a structure in which a plastic deformation material is laminated instead of a prepreg (PPG) substrate. According to an embodiment, in the printed circuit board 600, the plastic deformation material may be laminated between 1L layer and 2L layer, and the plastic deformation material may be laminated between 3L layer and 4L layer.

According to an embodiment, the plastic deformation material of the printed circuit board 600 may be a bonding sheet including a polymer material for inducing the plastic deformation of the printed circuit board 600. According to an embodiment, the plastic deformation material may be laminated on the first part 610 and the second part 620 of the printed circuit board 600, and may not be laminated on the third part 630 of the printed circuit board 600. For example, the plastic deformation material may include acryl, epoxy, and/or nitrile-butadiene rubber. For example, the bonding sheet may be a film including acryl, epoxy, and/or nitrile-butadiene rubber.

According to an embodiment, since the plastic deformation material is laminated on the first part 610 and the second part 620 of the printed circuit board 600, the first part 610 and the second part 620 may have the characteristics to be plastically deformed well as compared with the third part 630.

According to an embodiment, since the plastic deformation material is not laminated on the third part 630 of the printed circuit board 600, the third part 630 may have the characteristics to be elastically deformed well as compared with the first part 610 and the second part 620.

According to another embodiment, the printed circuit board 600 may include a laminated structure as in Table 2.

TABLE 2

| Layer | Material | | First part 610 (Component disposition area) | Second part 620 (Pre-forming area) | Third part 630 (Flexible area) |
|---|---|---|---|---|---|
| | EPOXY Adhesive | | | | |
| | COVERLAY (Normal Df) | C/L Film | ○ | ○ | X |
| | | C/L Adhesive | ○ | ○ | X |
| 1L | CCL (Low Df) | Cu plating | ○ | ○ | X |
| | | Copper(H/E) | ○ | ○ | X |
| | | Polyimide | ○ | ○ | X |
| | Plastic deformation material | | ○ | ○ | X |
| | COVERLAY (Normal Df) | C/L Film | X | X | ○ |
| | | C/L Adhesive | X | X | ○ |

TABLE 2-continued

| Layer | Material | | First part 610 (Component disposition area) | Second part 620 (Pre-forming area) | Third part 630 (Flexible area) |
|---|---|---|---|---|---|
| 2L | CCL (Low Df) | Copper | ○ | ○ | ○ |
|  |  | Polyimide | ○ | ○ | ○ |
| 3L |  | Copper | ○ | ○ | ○ |
|  | COVERLAY | C/L Adhesive | X | X | ○ |
|  | (Normal Df) | C/L Film | X | X | ○ |
|  | Plastic deformation material | | ○ | ○ | X |
| 4L | CCL (Low Df) | Polyimide | ○ | ○ | X |
|  |  | Copper(H/E) | ○ | ○ | X |
|  |  | Cu plating | ○ | ○ | X |
|  | COVERLAY | C/L Adhesive | ○ | ○ | X |
|  | (Normal Df) | C/L Film | ○ | ○ | X |
|  | Adhesive | | ○ | X | X |
|  | EPOXY | | ○ | X | X |
|  | PC(polycarbonate) sheet | | | | |

In Table 2, a part denoted by 0 may mean that a corresponding material is laminated on a corresponding layer. For example, in a cell in which a row corresponding to Cu plating of 1L layer in Table 1 and a column corresponding to the first part 610 cross each other, a case that 0 is denoted may mean that Cu plating is laminated on 1L layer in the first part 610 of the printed circuit board 600.

In Table 2, a part denoted by X may mean that a corresponding material is not laminated on a corresponding layer. For example, in a cell in which a row corresponding to Cu plating of 1L layer in Table 1 and a column corresponding to the third part 630 cross each other, a case that X is denoted may mean that Cu plating is not laminated on 1L layer in the third part 630 of the printed circuit board 600.

Referring to Table 2, in the printed circuit board 600 according to another embodiment, unlike the printed circuit board 600 illustrated in Table 1, Cu plating of 1L layer and Cu plating of 4L layer may be laminated even on the second part 620. For example, in the printed circuit board 600 according to an embodiment illustrated in Table 1, Cu plating of 1L layer and Cu plating of 4L layer may not be laminated on the second part 620, whereas in the printed circuit board 600 according to another embodiment illustrated in Table 2, Cu plating of 1L layer and Cu plating of 4L layer may be laminated on the second part 620.

According to another embodiment, the printed circuit board 600 may include a laminated structure as in Table 3. For example, the printed circuit board 600 having the laminated structure illustrated in Table 3, as illustrated in FIG. 8 to FIG. 11, may include a flexible display, and may be applied to a foldable electronic device (e.g., electronic device 800 of FIG. 8) capable of folding or unfolding at least a part of the electronic device.

TABLE 3

| Layer | Material | | First part 610 (Component disposition area) | Second part 620 (Pre-forming area) | Third part 630 (Flexible area) |
|---|---|---|---|---|---|
|  | EPOXY | | | | |
|  | Adhesive | | | | |
|  | COVERLAY | C/L Film | ○ | ○ | X |
|  | (Normal Df) | C/L Adhesive | ○ | ○ | X |
| 1L | CCL (Low Df) | Cu plating | ○ | ○ | X |
|  |  | Copper(H/E) | ○ | ○ | X |
|  |  | Polyimide | ○ | ○ | X |
|  | Plastic deformation material | | ○ | ○ | EMI Film |
|  | COVERLAY | C/L Film | X | X | ○ |
|  | (Normal Df) | C/L Adhesive | X | X | ○ |
| 2L | CCL (Low Df) | Copper | ○ | ○ | ○ |
|  |  | Polyimide | ○ | ○ | ○ |
|  | Plastic deformation material | | ○ | ○ | Air Gap |
|  | CCL (Low Df) | Polyimide | ○ | ○ | ○ |
| 3L |  | Copper | ○ | ○ | ○ |
|  | COVERLAY | C/L Adhesive | X | X | ○ |
|  | (Normal Df) | C/L Film | X | X | ○ |
|  | Plastic deformation material | | ○ | ○ | X |
| 4L | CCL (Low Df) | Polyimide | ○ | ○ | X |
|  |  | Copper(H/E) | ○ | ○ | X |
|  |  | Cu plating | ○ | ○ | X |
|  | COVERLAY | C/L Adhesive | ○ | ○ | X |
|  | (Normal Df) | C/L Film | ○ | ○ | X |
|  | Adhesive | | ○ | X | X |
|  | EPOXY | | ○ | X | X |
|  | PC(polycarbonate) sheet | | | | |

In Table 3, a part denoted by 0 may mean that a corresponding material is laminated on a corresponding layer. For example, in a cell in which a row corresponding to Cu plating of 1L layer in Table 1 and a column corresponding to the first part 610 cross each other, a case that 0 is denoted may mean that Cu plating is laminated on 1L layer in the first part 610 of the printed circuit board 600.

In Table 3, a part denoted by X may mean that a corresponding material is not laminated on a corresponding layer. For example, in a cell in which a row corresponding to Cu plating of 1L layer in Table 1 and a column corresponding to the third part 630 cross each other, a case that X is denoted may mean that Cu plating is not laminated on 1L layer in the third part 630 of the printed circuit board 600.

Referring to Table 3, in the printed circuit board 600 according to another embodiment, unlike the printed circuit board 600 illustrated in Table 2, the plastic deformation material may be further laminated between 2L layer and 3L layer. For example, in the printed circuit board 600 according to another embodiment according to Table 3, the plastic deformation material may be laminated between 1L layer and 2L layer, between 2L layer and 3L layer, and between 3L layer and 4L layer, respectively.

Referring to Table 3, in the third part 630 of the printed circuit board 600, a shielding film (electromagnetic interference (EMI) film) may be laminated between 1L layer and 2L layer. According to an embodiment, the shielding film may be formed on the same layer as the plastic deformation material partly formed between 1L layer and 2L layer.

Referring to Table 3, in the third part 630 of the printed circuit board 600, an air gap may be formed between 2L layer and 3L layer. According to an embodiment, the air gap may be formed on the same layer as the plastic deformation material partly formed between 2L layer and 3L layer.

According to various embodiments, the thickness of the plastic deformation material laminated on at least some of the layers of the printed circuit board 600 may be variously changed. According to an embodiment, the characteristics in that at least a part (e.g., first part 610 and/or second part 620) of the printed circuit board 600 is plastically deformed may be increased in proportion to the thickness of the plastic deformation material.

Figure 7:
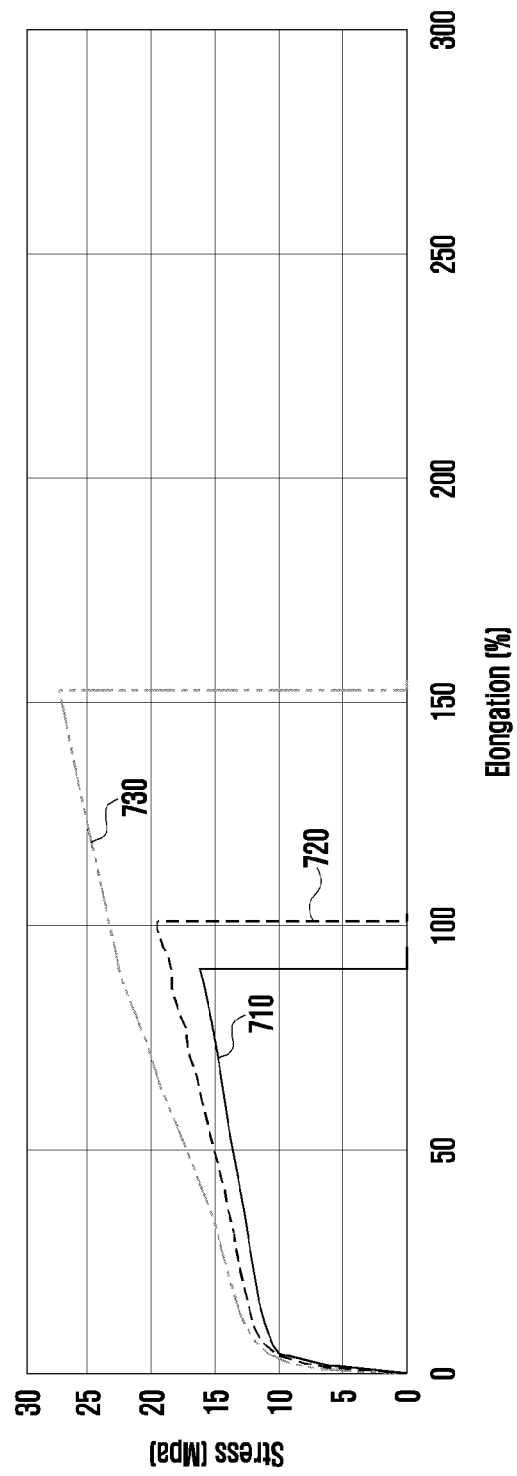
FIG. 7 is a graph explaining characteristics of a plastic deformation material according to an embodiment of the disclosure.

FIG. 7 is a graph explaining the characteristics of the plastic deformation material according to an embodiment of the disclosure. For example, FIG. 7 may be a graph representing measurement of a stress according to an elongation of a plastic deformation material.

Referring to FIG. 7, graph 710 may be a graph representing a case that the lamination thickness of the plastic deformation material is designed as about 13 μm in the printed circuit board (e.g., printed circuit board 600 of FIG. 6).

Referring to FIG. 7, graph 720 may be a graph representing a case that the lamination thickness of the plastic deformation material is designed as about 35 μm in the printed circuit board (e.g., printed circuit board 600 of FIG. 6).

Referring to FIG. 7, graph 730 may be a graph representing a case that the lamination thickness of the plastic deformation material is designed as about 40 μm in the printed circuit board (e.g., printed circuit board 600 of FIG. 6).

Referring to FIG. 7, the plastic deformation material according to various embodiments may have the characteristics in that the elastic deformation occurs in a region in which an elongation is less than 10%, and the plastic deformation occurs in a region in which the elongation is about 10% to 80%.

Referring to FIG. 7, the slope of the graph representing the measurement of the stress according to the elongation may be defined as a modulus value. As illustrated, the plastic deformation material according to various embodiments may have the characteristics in that a modulus value is equal to or smaller than about 15 MPa in the region in which the plastic deformation occurs, that is, in the region in which the elongation is about 10% to 80%.

Referring to FIG. 7, the plastic deformation material according to various embodiments may have the characteristics in that a break (cutoff) occurs in a region in which the elongation is equal to or larger than 80%.

Figure 8:
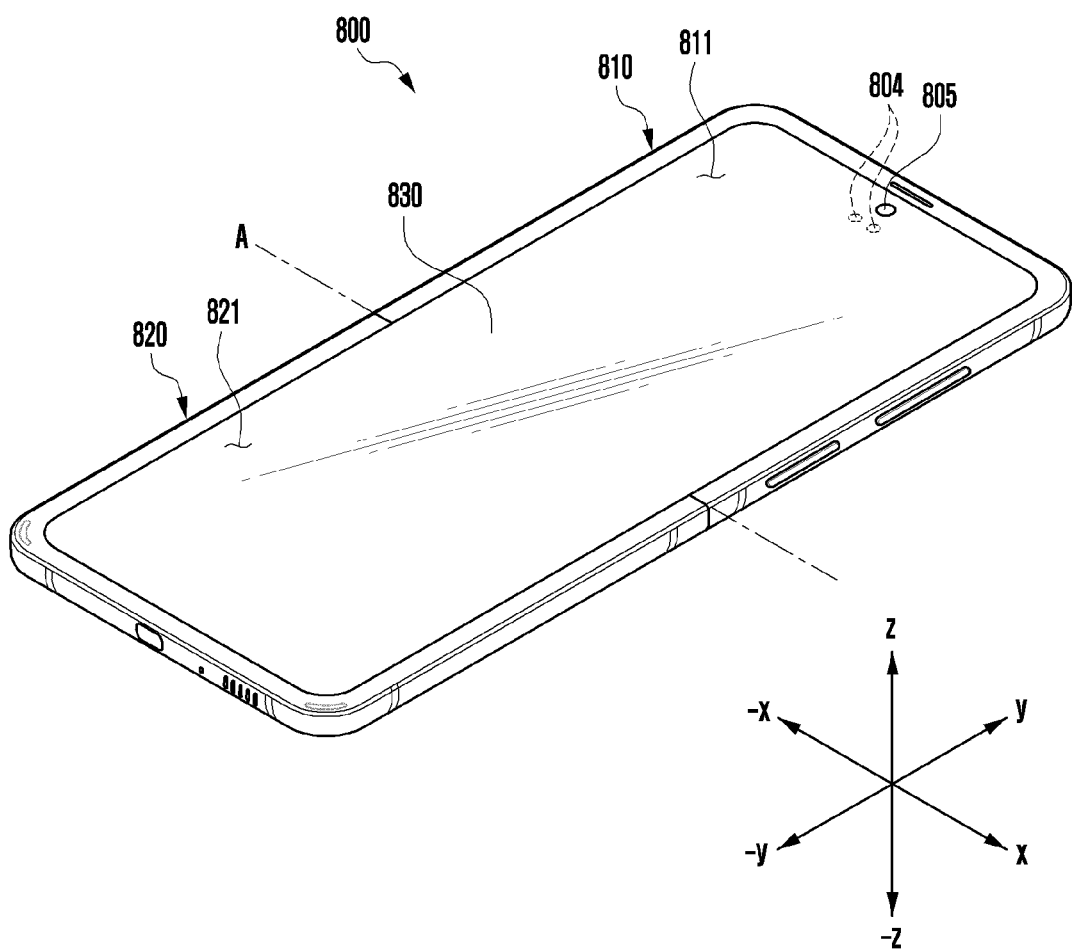
FIG. 8 is a perspective view of an electronic device illustrating an unfolding state (flat stage or unfolding state) according to an embodiment of the disclosure.
Figure 9:
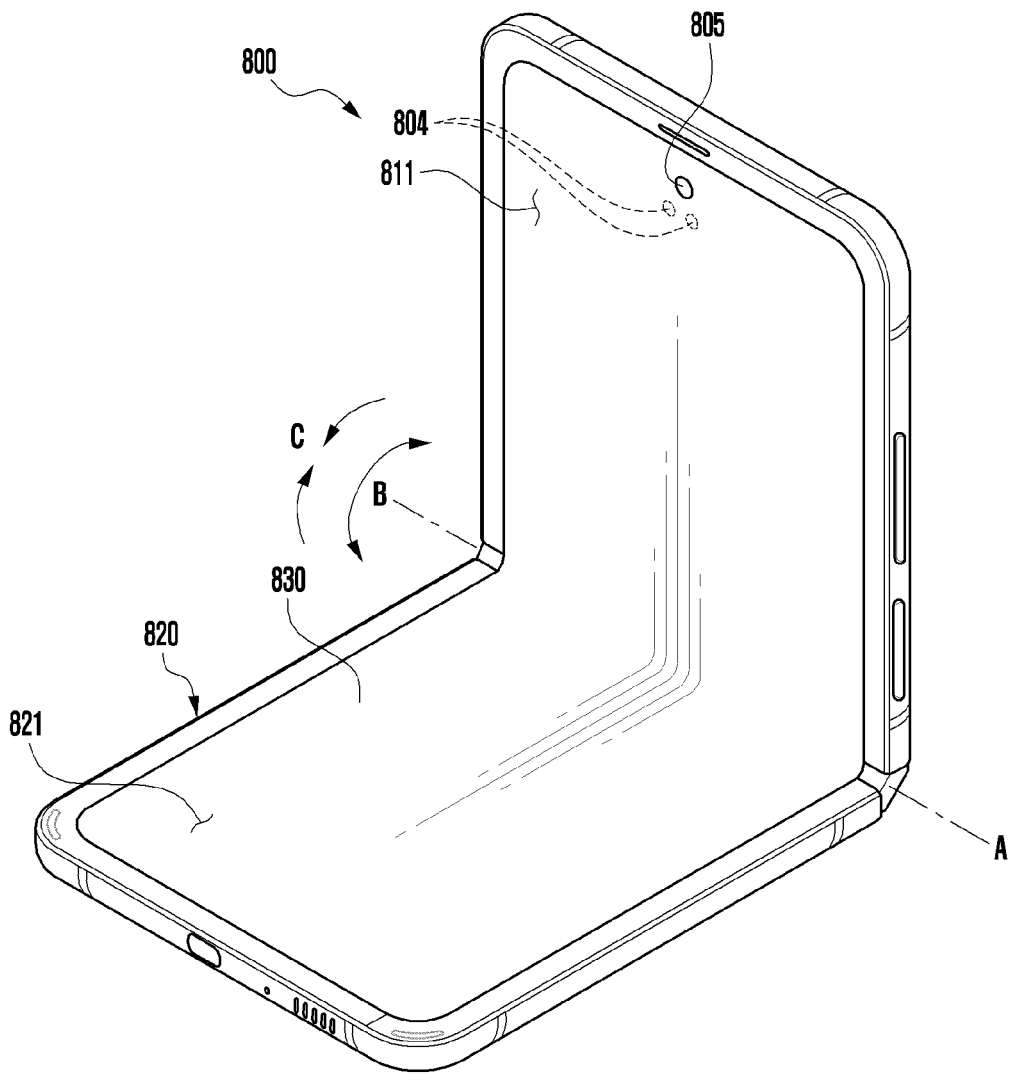
FIG. 9 is a perspective view of an electronic device illustrating an intermediate state according to an embodiment of the disclosure.
Figure 10:
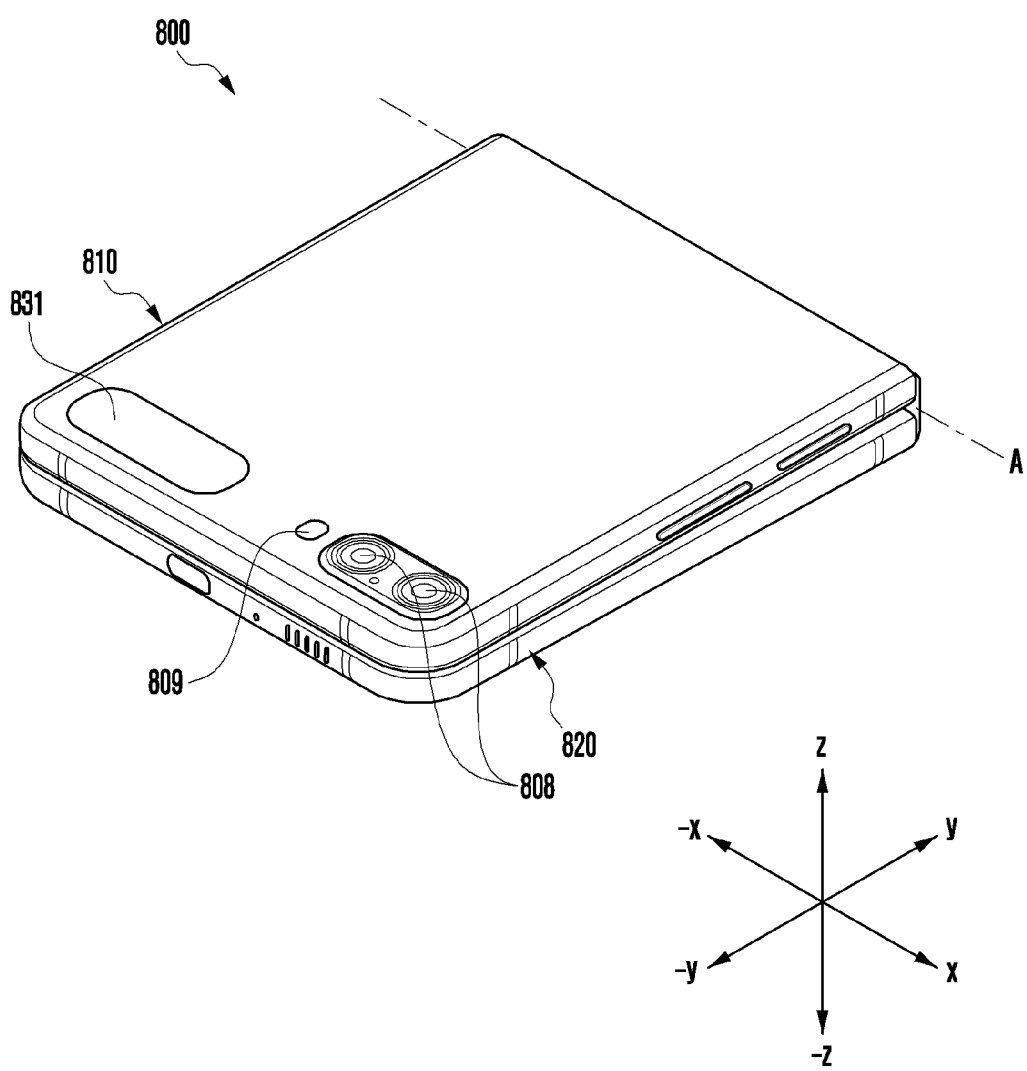
FIG. 10 is a perspective view of an electronic device illustrating a folding state according to an embodiment of the disclosure.

FIG. 8 is a perspective view of an electronic device illustrating an unfolding state (flat stage or unfolding state) according to an embodiment of the disclosure. FIG. 9 is a perspective view of an electronic device illustrating an intermediate state according to an embodiment of the disclosure. FIG. 10 is a perspective view of an electronic device illustrating a folding state according to an embodiment of the disclosure.

Referring to FIGS. 8 to 10, an electronic device 800 may be a foldable electronic device of which at least a part is folded. According to an embodiment, the electronic device may include a pair of first and second housings 810 and 820 (e.g., foldable housings) rotatably combined with each other to be folded to face each other based on a hinge module (e.g., hinge module 890 of FIG. 11). In a certain embodiment, the hinge module (e.g., hinge module 890 of FIG. 11) may be disposed in an X-axis direction or a Y-axis direction of the electronic device. In a certain embodiment, the electronic device may include at least one hinge module (e.g., hinge module 890 of FIG. 11) being folded in substantially the same direction or in different directions.

According to an embodiment, the electronic device 800 may include a flexible display 830 (e.g., foldable display) disposed in an area formed by the pair of first and second housings 810 and 820. According to an embodiment, the first housing 810 and the second housing 820 may be disposed on both sides around a folding axis (axis A), and may have shapes substantially symmetrical to each other with respect to the folding axis (axis A).

According to an embodiment, the first housing 810 and the second housing 820 may have different angles or distances depending on whether the electronic device 800 is in a flat state or unfolding state, in a folding state, or in an intermediate state.

According to various embodiments, the pair of first and second housings 810 and 820 may include the first housing 810 (e.g., first housing structure) combined with the hinge module (e.g., hinge module 890 of FIG. 11) and the second housing 820 (e.g., second housing structure) combined with the hinge module (e.g., hinge module 890 of FIG. 11).

According to an embodiment, the first housing 810, in the unfolding state, may include a first side 811 directed in a first direction (e.g., front direction) (z-axis direction), and a second side (not illustrated) directed in a second direction (e.g., rear direction) (−z-axis direction) facing the first side 811.

According to an embodiment, the second housing 820, in the unfolding state, may include a third side 821 directed in the first direction (z-axis direction), and a fourth side (not illustrated) directed in the second direction (−z-axis direction).

According to an embodiment, in the unfolding state of the electronic device 800, the first side 811 of the first housing 810 and the third side 821 of the second housing 820 may be directed in substantially the same first direction (z-axis direction), and in the folding state, the first side 811 and the third side 821 may face each other.

According to an embodiment, the electronic device 800 may operate in a manner that in the unfolding state, the second side (not illustrated) of the first housing 810 and the fourth side (not illustrated) of the second housing 820 are directed in substantially the same second direction (−z-axis direction), and in the folding state, the second side (not illustrated) and the fourth side (not illustrated) are directed in opposite directions. For example, in the folding state, the second side (not illustrated) may be directed in the first direction (z-axis direction), and the fourth side (not illustrated) may be directed in the second direction (−z-axis direction).

According to various embodiments, the electronic device 800 may include a sub-display 831 disposed separately from the flexible display 830. According to an embodiment, in case that the electronic device 800 is in the folding state, the sub-display 831 may display status information of the electronic device 800 to replace the display function of the flexible display 830.

According to various embodiments, the electronic device 800 may include a sensor module 804 and first and second camera devices 805 and 808.

According to an embodiment, the sensor module 804 (e.g., illuminance sensor) may be disposed under the flexible display 830 (e.g., in the second direction (−z-axis direction from the flexible display 830), and may detect an external environment through the flexible display 830.

According to an embodiment, the sensor module 804 may include at least one of a gesture sensor, a gyro sensor, a barometric pressure sensor, a magnetic sensor, an acceleration sensor, a grip sensor, a color sensor, an infrared (IR) sensor, a biosensor, a temperature sensor, a humidity sensor, an illuminance sensor, a proximity sensor, a biosensor, an ultrasonic sensor, or the illuminance sensor (e.g., sensor module 804).

According to various embodiments, the first and second camera devices 805 and 808 may include a first camera device 805 (e.g., front camera device) disposed on the first side 811 of the first housing 810 and a second camera device 808 disposed on the second side 812 of the first housing 810.

According to an embodiment, the electronic device 800 may further include a flash 809 disposed near the second camera device 808. According to an embodiment, the first and second camera devices 805 and 808 may include one or a plurality of lenses, an image sensor, and/or an image signal processor.

According to an embodiment, the flash 809 may include a light-emitting diode or a xenon lamp.

According to an embodiment, the first and second camera devices 805 and 808 may be disposed so that two or more lenses (e.g., wide angle lens, ultra-wide angle lens, or telephoto lens) and image sensors are located on one side (e.g., first side 811, second side 812, third side 821, or fourth side 822) of the electronic device 800. In a certain embodiment, the first and second camera devices 805 and 808 may include lenses for time of flight (TOF) and/or an image sensor.

Referring to FIG. 9, the electronic device 800 according to an embodiment may operate to be transitioned to an unfolding state (e.g., unfolding state of FIG. 8) if a pressing force is provided in an unfolding direction (direction B) in a state where the electronic device 800 is unfolded at a predetermined angle of inflection through the hinge module (e.g., hinge module 890 of FIG. 11). According to an embodiment, the electronic device 800 may operate to be transitioned to a close state (e.g., folding state of FIG. 10) if a pressing force is provided in a folding direction (direction C) in a state where the electronic device 800 is unfolded at the predetermined angle of inflection through the hinge module (e.g., hinge module 890 of FIG. 11). In an embodiment, the electronic device 800 may operate to maintain the unfolded state (not illustrated) at various angles through the hinge module (e.g., hinge module 890 of FIG. 11).

FIG. 11 is a view explaining a printed circuit board installed inside a foldable electronic device according to an embodiment of the disclosure. For example, FIG. 11 may be an example schematically illustrating a rear side of the electronic device illustrated in FIG. 8.

The electronic device illustrated in FIG. 11 may be at least partly similar to the electronic device 800 of FIGS. 8 to 10, or may include another embodiment of the electronic device.

Referring to FIG. 11, an electronic device 800 (e.g., electronic device 800 of FIG. 8) according to an embodiment may include a pair of first and second housings 810 and 820 (e.g., foldable housings) rotatably combined with each other to be folded to face each other based on the hinge module 890.

According to an embodiment, the electronic device 800 may include the circuit board 600 disposed to extend from the first housing 810 to the second housing 820 across the hinge module 890. For example, the printed circuit board 600 may include a part disposed in the first housing 810, a part disposed in the second housing 820, and a part disposed adjacent to the hinge module 890 to connect the above parts to each other.

According to an embodiment, the printed circuit board 600 may electrically (or operably) connect at least one component (e.g., main PCB) disposed in the first housing 810 to at least one component (e.g., antenna module) disposed in the second housing 820.

According to an embodiment, the printed circuit board 600 may include a laminated structure described above with reference to Table 3. According to an embodiment, the printed circuit board 600, as described above, may include the component disposition area of first part 610 in which at least one component is disposed, the pre-forming area of second part 620, and/or the flexible area of third part 630.

According to an embodiment, the flexible area of third part 630 of the printed circuit board 600 may be disposed adjacent to the hinge module 890, and thus may have high reliability without being damaged even if the electronic device 800 is repeatedly folded or unfolded.

According to an embodiment, the pre-forming area of second part 620 of the printed circuit board 600 may be formed on one part of the first housing 810 adjacent to the hinge module 890 to correspond to the shape of a storage space of the printed circuit board 600 provided inside the first housing 810. According to an embodiment, the pre-forming area of second part 620 of the printed circuit board 600 may be formed on one part of the second housing 820 adjacent to the hinge module 890 to correspond to the shape of the storage space of the printed circuit board 600 provided inside the second housing 820.

Figure 12:
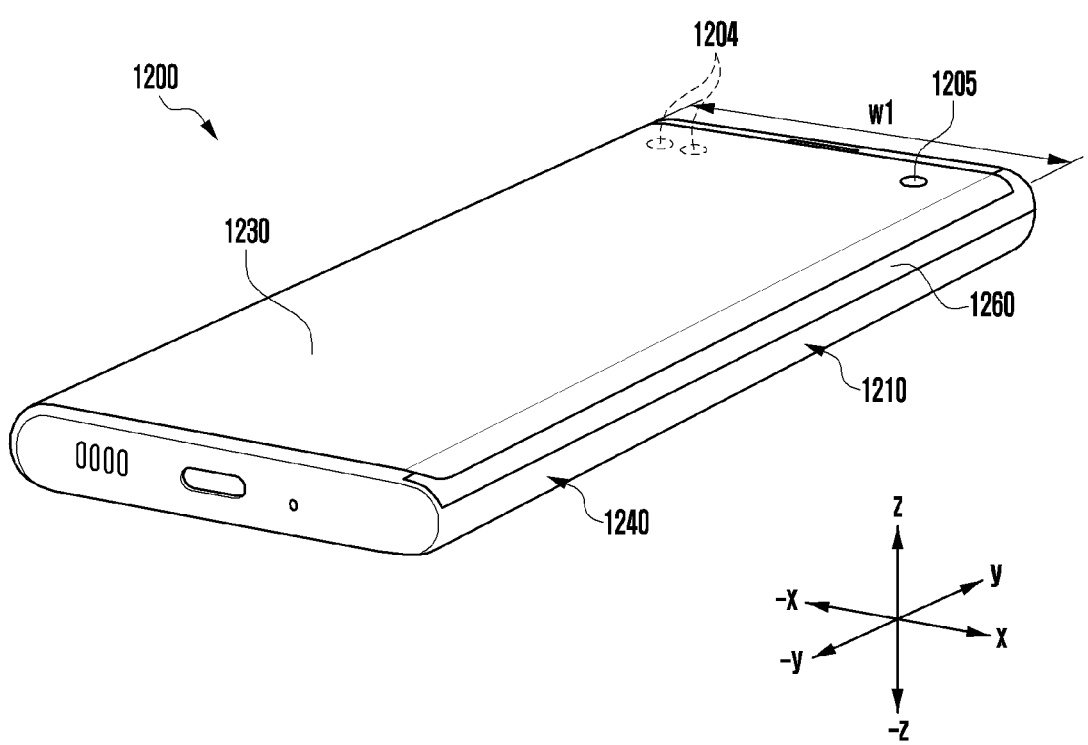
FIG. 12 is a perspective view of an electronic device illustrating a slide-in state according to an embodiment of the disclosure.
Figure 13:
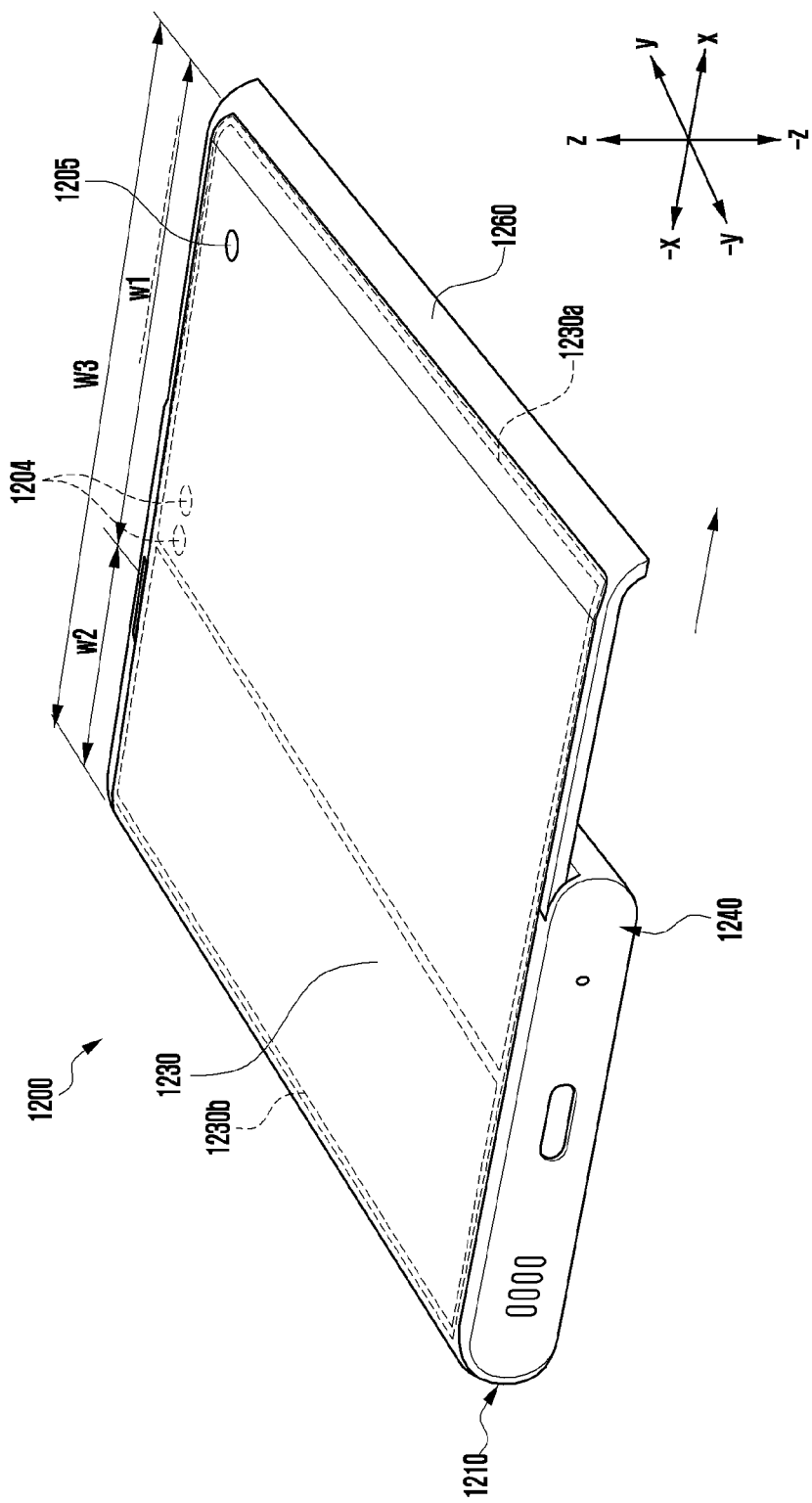
FIG. 13 is a perspective view of an electronic device illustrating a slide-out state according to an embodiment of the disclosure.

FIG. 12 is a perspective view of an electronic device illustrating a slide-in state according to an embodiment of the disclosure. FIG. 13 is a perspective view of an electronic device illustrating a slide-out state according to an embodiment of the disclosure.

Referring to FIGS. 12 and 13, an electronic device 1200 according to various embodiments of the disclosure may be defined as a slidable electronic device since a part of the housing (e.g., slide plate 1260) performs slide movement, or may be defined as a rollable electronic device since at least a part of a flexible display 1230 is designed to be wound.

Referring to FIGS. 12 and 13, the electronic device 1200 according to an embodiment may include a housing 1210 (e.g., housing structure or first housing) and a slide plate 1260 (e.g., second housing) at least partly movably combined from the housing 1210 and supporting at least a part of the flexible display 1230.

According to an embodiment, the housing 1210 of the electronic device 1200 may include a side member 1240 surrounding the side of the electronic device 1200. According to an embodiment, the slide plate 1260 may be inserted from one side of the housing formed by the side member 1240 into the housing 1210, or may be drawn out of the housing.

According to an embodiment, the electronic device 1200 may include a bendable hinge rail (e.g., multi-bar assembly) (not illustrated) combined with an end part of the slide plate 1260 and supporting at least a part of the flexible display 1230. For example, in case that the slide plate 1260 performs a sliding operation in the housing 1210, the hinge rail (not illustrated) may at least partly enter into the inner space of the housing 1210 while supporting the flexible display 1230, or may be drawn out of the inner space.

According to an embodiment, the hinge rail (not illustrated) may enter into the inner space of the housing 1210 or may be drawn out of the inner space based on the movement or rotation of a roller (e.g., roller 1430 of FIG. 14) disposed inside the housing 1210.

According to an embodiment, the slide plate 1260 may support the flexible display 1230, and may expand the display area of the flexible display 1230 or may collapse the display area of the flexible display 1230 through the slide movement thereof.

According to various embodiments, the electronic device 1200 may include the housing 1210 and the flexible display 1230 disposed to be supported by the slide plate 1260.

According to an embodiment, the flexible display 1230 may include a first part 1230a being supported by the slide plate 1260 and a second part 1230b extending from the first part 1230a and being supported by a hinge rail (not illustrated).

According to an embodiment, the second part 1230b of the flexible display 1230 may enter into the inner space of the housing 1210 in a state where the electronic device 1200 is in a slide-in state (e.g., in a state where the slide plate 1260 enters into the housing 1210), and may be disposed not to be visually exposed to an outside, and may extend from the first part 1230a to be visually exposed to the outside while being supported by the hinge rail (not illustrated) in a state where the electronic device 1200 is in a slide-out state (e.g., in a state where the slide plate 1260 is drawn out of the housing 1210).

According to an embodiment, the display area of the flexible display 1230 in the slide-in state may be a first width w1 since only the first part 610 or the first part 1230a of the flexible display 1230 is visually exposed.

According to an embodiment, the display area of the flexible display 1230 in the slide-out state may be a third width w3 that is larger than the first width w1 as much as a second width w2 since the first part 610 or the first part 1230a and the second part 1230b of the flexible display 1230 is exposed. For example, the display area of the flexible display 1230 in the slide-out state may be expanded as much as the second width w2 that is the maximum width of the second part 620 or the second part 1230b.

According to various embodiments, the electronic device 1200 may include a sensor module 1204 and a camera device 1205.

According to an embodiment, the sensor module 1204 (e.g., illuminance sensor) may be disposed under the flexible display 1230 (e.g., in the second direction (−z-axis direction) from the flexible display 1230, and may detect an external environment through the flexible display 1230.

According to an embodiment, the sensor module 1204 may include at least one of a gesture sensor, a gyro sensor, a barometric pressure sensor, a magnetic sensor, an acceleration sensor, a grip sensor, a color sensor, an infrared (IR) sensor, a biosensor, a temperature sensor, a humidity sensor, an illuminance sensor, a proximity sensor, a biosensor, an ultrasonic sensor, or the illuminance sensor (e.g., sensor module 1204).

According to an embodiment, the camera device 1205 may include one lens or two or more lenses (e.g., wide angle lens, ultra-wide angle lens, or telephoto lens) and image sensors. In a certain embodiment, the camera device 1205 may include lenses for time of flight (TOF) and/or an image sensor.

Figure 14:
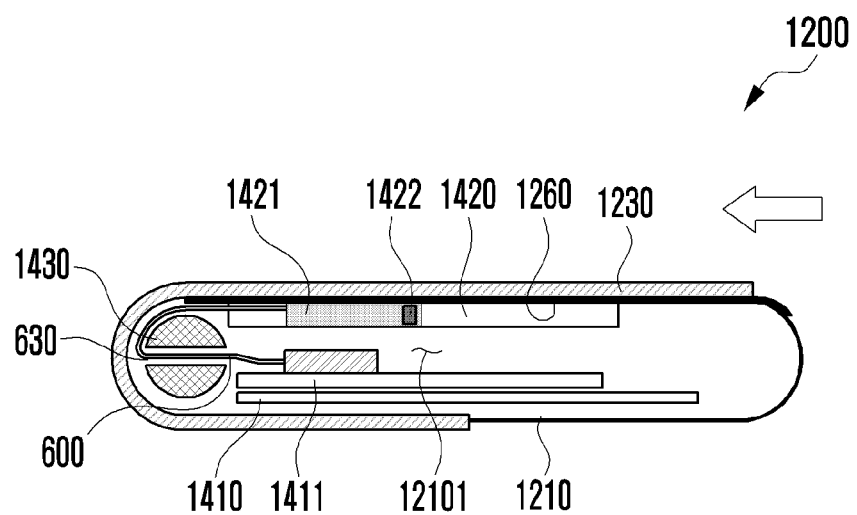
FIG. 14 is a perspective view of an electronic device illustrating a slide-in state according to an embodiment of the disclosure.
Figure 15:
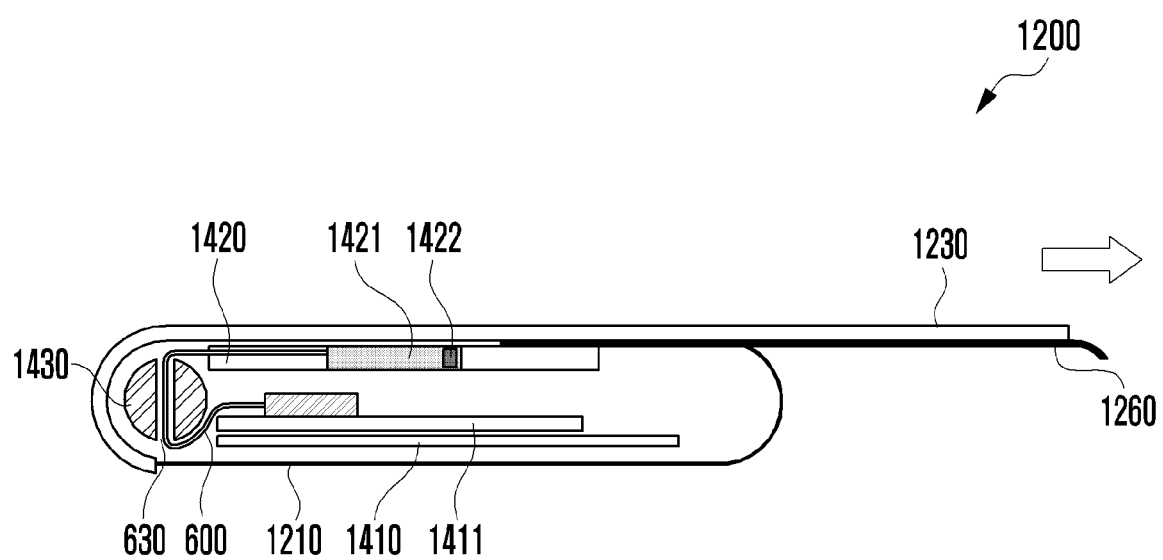
FIG. 15 is a perspective view of an electronic device illustrating a slide-out state according to an embodiment of the disclosure.

FIG. 14 is a perspective view of an electronic device illustrating a slide-in state according to an embodiment of the disclosure. FIG. 15 is a perspective view of an electronic device illustrating a slide-out state according to an embodiment of the disclosure.

The electronic device illustrated in FIG. 14 and FIG. 15 may be at least partly similar to the electronic device 1200 of FIG. 13 and FIG. 14, or may include another embodiment of the electronic device.

Referring to FIGS. 14 and 15, an electronic device 1200 (e.g., electronic device 1200 of FIG. 12) according to an embodiment may include a housing (e.g., housing 1210 of FIG. 12) and a slide plate (e.g., slide plate 1260 of FIG. 12) at least partly movably combined from the housing 1210 and supporting at least a part of the flexible display (e.g., flexible display 1230 of FIG. 12).

According to an embodiment, the electronic device 1200 may include a bendable hinge rail (e.g., multi-bar assembly) (not illustrated) combined with an end part of the slide plate 1260 and supporting at least a part of the flexible display 1230. For example, in case that the slide plate 1260 performs a sliding operation in the housing 1210, the hinge rail (not illustrated) may at least partly enter into the inner space of the housing 1210 while supporting the flexible display 1230, or may be drawn out of an inner space 12101.

According to an embodiment, the hinge rail (not illustrated) may enter into the inner space 12101 of the housing 1210 or may be drawn out of the inner space 12101 based on the movement or rotation of a roller 1430 disposed inside the housing 1210.

According to an embodiment, a main bracket 1410 may be disposed in the inner space 12101 of the housing 1210, and a main PCB 1411 may be disposed on the main bracket 1410.

According to an embodiment, in the inner space 12101 of the housing 1210, a sub-bracket 1420 supporting at least a part of the slide plate 1260 may be disposed, and on the sub-bracket 1420, a sub-PCB 1421 on which at least one component (e.g., at least one component related to an antenna) is disposed may be disposed.

According to an embodiment, in the inner space 12101 of the housing 1210, the printed circuit board 600 electrically (or operably) connecting the main PCB 1411 disposed on the main bracket 1410 and the sub-PCB 1421 disposed on the sub-bracket 1420 with each other may be disposed.

According to an embodiment, the printed circuit board 600 may be fastened to the main PCB 1411, and may be extended from the main PCB 1411 to the sub-bracket 1420 via an inside of the roller 1430 (or a circumference of the roller 1430), so that the printed circuit board 600 may be fastened to the connector 1422 of the sub-PCB 1421 disposed on the sub-bracket 1420.

According to an embodiment, the printed circuit board 600 may include the laminated structure described above with reference to Table 1 to Table 3. According to an embodiment, the printed circuit board 600, as described above, may include the component disposition area of first part 610 in which at least one component is disposed, the pre-forming area of second part 620, and/or the flexible area of third part 630.

According to an embodiment, the flexible area of third part 630 of the printed circuit board 600 may be disposed adjacent to the roller 1430, and thus may have high reliability without being damaged even if the slide plate 1260 of the electronic device repeatedly performs the slide movement.

In the printed circuit board according to various embodiments of the disclosure, since the part that can be elastically deformed well and the part that can be plastically deformed well are partially formed, the printed circuit board may have both the elastic deformation characteristics and the plastic deformation characteristics which are in a trade-off relationship.

The printed circuit board according to various embodiments of the disclosure may be formed to be able to be partially plastically deformed, and thus may be easily assembled and disassembled.

The printed circuit board according to various embodiments of the disclosure may be formed to have partially flexible characteristics, and thus can provide the robust structure that is not broken even by repeated bending operations (e.g., more than two hundred thousand times bending operations) when being assembled and disassembled.

Since the printed circuit board according to various embodiments of the disclosure does not necessitate a thermal process (e.g., thermoplastic resin forming process) for a partial plastic deformation process in the flexible printed circuit board (e.g., FPCB), the manufacturing unit price can be decreased, and the manufacturing costs can be saved.

The printed circuit board according to various embodiments of the disclosure may be a substrate in which a polymer material for shape forming is laminated on at least some layers of the FPCB and the layers are bonded by the corresponding material.

The printed circuit board according to various embodiments of the disclosure may be a substrate in which an elastic dielectric material for securing flexibility and a plastic dielectric material for shape maintenance are complexly laminated.

The printed circuit board according to various embodiments of the disclosure may be a substrate of a complex structure using an additional material (e.g., gold or curing ink) for inducing the elastic deformation and plastic deformation on a multi-layer substrate in addition to a polymer material.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:
   a housing; and
   a printed circuit board disposed at an inner space of the housing,
   wherein the printed circuit board comprises:
      a component disposition area on which at least one component is disposed,
      a pre-forming area on which a plastic deformation material is laminated as a polymer material for inducing plastic deformation on a part of the printed circuit board, and
      a flexible area on which the plastic deformation material is not laminated, the flexible area comprising flexible characteristics,
   wherein the pre-forming area is pre-bent to correspond to a bent area at a corner part of the inner space of the housing.

2. The electronic device of claim 1, wherein the flexible area is disposed adjacent to a connector disposition area on which a connector of the printed circuit board is disposed.

3. The electronic device of claim 1,
   wherein the plastic deformation material causes an elastic deformation to occur in a region in which an elongation is less than 10%, and
   wherein the plastic deformation material causes the plastic deformation to occur in a region in which the elongation is within 10% to 80%.

4. The electronic device of claim 3, wherein the plastic deformation material has characteristics in that a modulus value is equal to or smaller than 15 MPa in the region in which the elongation is within 10% to 80%.

5. The electronic device of claim 3, wherein the plastic deformation material has characteristics in that a break occurs in a region in which the elongation is equal to or larger than 80%.

6. The electronic device of claim 1,
   wherein the printed circuit board is formed in a 4-layer structure comprising four copper layers, and
   wherein the plastic deformation material is laminated between a first copper layer and a second copper layer and between a third copper layer and a fourth copper layer of the printed circuit board.

7. The electronic device of claim 1,
   wherein the printed circuit board is formed in a 4-layer structure comprising four copper layers, and
   wherein the plastic deformation material is laminated between a first copper layer and a second copper layer, between the second copper layer and a third copper layer, and between the third copper layer and a fourth copper layer of the printed circuit board.

8. The electronic device of claim 7,
   wherein the plastic deformation material is not laminated in the flexible area of the printed circuit board, and
   wherein a shielding film is laminated on a same layer as the plastic deformation material.

9. The electronic device of claim 7,
   wherein the plastic deformation material is not laminated in the flexible area of the printed circuit board, and
   wherein an air gap is formed on a same layer as the plastic deformation material.

10. The electronic device of claim 1, wherein the electronic device comprises a bar type shape.

11. The electronic device of claim 1,
wherein the housing comprises a foldable housing that is foldable based on a hinge module, and
wherein the flexible area of the printed circuit board is disposed adjacent to the hinge module.

12. The electronic device of claim 1, further comprising:
a slide plate configured to slide in a designated direction from the housing based on a movement of a roller located inside the housing; and
a flexible display supported by the housing and the slide plate,
wherein the printed circuit board is disposed to pass through the roller, and electrically connects different components located inside the housing to each other, and
wherein the flexible area of the printed circuit board is disposed adjacent to the roller.

13. A printed circuit board electrically connecting different components of an electronic device to each other, the printed circuit board comprising:
a component disposition area on which at least one component is disposed;
a pre-forming area on which a plastic deformation material is laminated as a polymer material for inducing plastic deformation on a part of the printed circuit board; and
a flexible area on which the plastic deformation material is not laminated, the flexible area comprising flexible characteristics,
wherein the pre-forming area is pre-bent to correspond to a bent area at a corner part of an inner space of a housing of the electronic device.

14. The printed circuit board of claim 13, wherein the flexible area is disposed adjacent to a connector disposition area on which a connector of the printed circuit board is disposed.

15. The printed circuit board of claim 13,
wherein the plastic deformation material causes an elastic deformation to occur in a region in which an elongation is less than 10%, and
wherein the plastic deformation material causes the plastic deformation to occur in a region in which the elongation is within 10% to 80%.

16. The printed circuit board of claim 15, wherein the plastic deformation material has characteristics in that a modulus value is equal to or smaller than 15 MPa in the region in which the elongation is within 10% to 80%.

17. The printed circuit board of claim 15, wherein the plastic deformation material has characteristics in that a break occurs in a region in which the elongation is equal to or larger than 80%.

18. The printed circuit board of claim 13,
wherein the printed circuit board is formed in a 4-layer structure comprising four copper layers, and
wherein the plastic deformation material is laminated between a first copper layer and a second copper layer and between a third copper layer and a fourth copper layer of the printed circuit board.

19. The printed circuit board of claim 13,
wherein the printed circuit board is formed in a 4-layer structure comprising four copper layers, and
wherein the plastic deformation material is laminated between a first copper layer and a second copper layer, between the second copper layer and a third copper layer, and between the third copper layer and a fourth copper layer of the printed circuit board.

20. The printed circuit board of claim 19,
wherein the plastic deformation material is not laminated in the flexible area of the printed circuit board, and
wherein a shielding film is laminated, or an air gap is formed, on a same layer as the plastic deformation material.

21. The printed circuit board of claim 13, wherein the pre-forming area comprises at least two separate areas disposed between the component disposition area and the flexible area of the printed circuit board.

22. The printed circuit board of claim 13,
wherein the printed circuit board is configured to pass through a roller, and
wherein a bending configuration of the printed circuit board is based on a position state of the roller.

23. The printed circuit board of claim 13, wherein the flexible area comprises a structure in which polyimide flexible copper clad laminate (FCCL)/coverlay is laminated.

* * * * *